(12) United States Patent
Hirai

(10) Patent No.: US 6,990,039 B2
(45) Date of Patent: Jan. 24, 2006

(54) SEMICONDUCTOR STORING DEVICE

(75) Inventor: Takayasu Hirai, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/506,868

(22) PCT Filed: Mar. 5, 2003

(86) PCT No.: PCT/JP03/02586

§ 371 (c)(1),
(2), (4) Date: Sep. 3, 2004

(87) PCT Pub. No.: WO03/075280

PCT Pub. Date: Sep. 12, 2003

(65) Prior Publication Data

US 2005/0117398 A1 Jun. 2, 2005

(30) Foreign Application Priority Data

Mar. 6, 2002 (JP) .............................. 2002-060640

(51) Int. Cl.
*G11C 8/00* (2006.01)
(52) U.S. Cl. .............................. 365/230.06; 365/189.05
(58) Field of Classification Search ........... 365/230.06, 365/230.08, 207, 189.05
See application file for complete search history.

(56) References Cited

U.S. PATENT DOCUMENTS 5,566,128 A * 10/1996 Magome ................ 365/230.06
5,717,507 A    2/1998 Vondran, Jr.

FOREIGN PATENT DOCUMENTS

| JP | 5-113928    | 5/1993  |
|----|-------------|---------|
| JP | 6-349268    | 12/1994 |
| JP | 10-117292   | 5/1998  |
| JP | 10-320973   | 12/1998 |
| JP | 2001-93281  | 4/2001  |
| JP | 2003-101806 | 4/2003  |

* cited by examiner

*Primary Examiner*—Thong Q. Le
(74) *Attorney, Agent, or Firm*—Cooper & Dunham LLP

(57) ABSTRACT

A semiconductor storing device can access a plurality of addresses simultaneously without increasing a circuit area and a wiring area. A row of memory cells is selected by two stages of a word line and a division word line. An address is specified by X[i:0], Y[j:0], and Z[k:0]. Two roots of selection signals are alternately provided to division word line selectors arranged in one memory array. One of two roots of the selection signals is enabled to select the division word line selector. Eight roots of the selection signals in the entire semiconductor storing device are enabled to access eight addresses simultaneously.

12 Claims, 21 Drawing Sheets

FIG.2

| X ADDRESS | | | | | | | | | | | | | | | | |
|---|---|---|---|---|---|---|---|---|---|---|---|---|---|---|---|---|
| 11 | (0,0,3) | (0,1,3) | (0,2,3) | (0,3,3) | (1,0,3) | (1,1,3) | (1,2,3) | (1,3,3) | (2,0,3) | (2,1,3) | (2,2,3) | (2,3,3) | (3,0,3) | (3,1,3) | (3,2,3) | (3,3,3) |
| 10 | (0,0,2) | (0,1,2) | (0,2,2) | (0,3,2) | (1,0,2) | (1,1,2) | (1,2,2) | (1,3,2) | (2,0,2) | (2,1,2) | (2,2,2) | (2,3,2) | (3,0,2) | (3,1,2) | (3,2,2) | (3,3,2) |
| 01 | (0,0,1) | (0,1,1) | (0,2,1) | (0,3,1) | (1,0,1) | (1,1,1) | (1,2,1) | (1,3,1) | (2,0,1) | (2,1,1) | (2,2,1) | (2,3,1) | (3,0,1) | (3,1,1) | (3,2,1) | (3,3,1) |
| 00 | (0,0,0) | (0,1,0) | (0,2,0) | (0,3,0) | (1,0,0) | (1,1,0) | (1,2,0) | (1,3,0) | (2,0,0) | (2,1,0) | (2,2,0) | (2,3,0) | (3,0,0) | (3,1,0) | (3,2,0) | (3,3,0) |

| Y ADDRESS | 00 | 01 | 10 | 11 | 00 | 01 | 10 | 11 | 00 | 01 | 10 | 11 | 00 | 01 | 10 | 11 |
|---|---|---|---|---|---|---|---|---|---|---|---|---|---|---|---|---|
| Z ADDRESS | 00 | | | | 01 | | | | 10 | | | | 11 | | | |

| (0,2,2) | (2,2,2) | (0,2,3) | (2,2,3) | (1,2,2) | (3,2,2) | (1,2,3) | (3,2,3) | | (0,3,2) | (2,3,2) | (0,3,3) | (2,3,3) | (1,3,2) | (3,3,2) | (1,3,3) | (3,3,3) |
| --- | --- | --- | --- | --- | --- | --- | --- | --- | --- | --- | --- | --- | --- | --- | --- | --- |
| (0,2,0) | (2,2,0) | (0,2,1) | (2,2,1) | (1,2,0) | (3,2,0) | (1,2,1) | (3,2,1) | | (0,3,0) | (2,3,0) | (0,3,1) | (2,3,1) | (1,3,0) | (3,3,0) | (1,3,1) | (3,3,1) |
| (0,0,2) | (2,0,2) | (0,0,3) | (2,0,3) | (1,0,2) | (3,0,2) | (1,0,3) | (3,0,3) | ROW DECODER | (0,1,2) | (2,1,2) | (0,1,3) | (2,1,3) | (1,1,2) | (3,1,2) | (1,1,3) | (3,1,3) |
| (0,0,0) | (2,0,0) | (0,0,1) | (2,0,1) | (1,0,0) | (3,0,0) | (1,0,1) | (3,0,1) | | (0,1,0) | (2,1,0) | (0,1,1) | (2,1,1) | (1,1,0) | (3,1,0) | (1,1,1) | (3,1,1) |
| ⓪ | ⑥ | ① | ④ | ⑦ | ② | ⑤ | ③ | | ② | ④ | ③ | ⑤ | ⑥ | ⓪ | ⑦ | ① |

FIG.4B (z, y, x) = (1, 1, 0)

| (0,2,2) | (2,2,2) | (0,2,3) | (2,2,3) | (1,2,2) | (3,2,2) | (1,2,3) | (3,2,3) | | (0,3,2) | (2,3,2) | (0,3,3) | (2,3,3) | (1,3,2) | (3,3,2) | (1,3,3) | (3,3,3) |
| --- | --- | --- | --- | --- | --- | --- | --- | --- | --- | --- | --- | --- | --- | --- | --- | --- |
| (0,2,0) | (2,2,0) | (0,2,1) | (2,2,1) | (1,2,0) | (3,2,0) | (1,2,1) | (3,2,1) | | (0,3,0) | (2,3,0) | (0,3,1) | (2,3,1) | (1,3,0) | (3,3,0) | (1,3,1) | (3,3,1) |
| (0,0,2) | (2,0,2) | (0,0,3) | (2,0,3) | (1,0,2) | (3,0,2) | (1,0,3) | (3,0,3) | ROW DECODER | (0,1,2) | (2,1,2) | (0,1,3) | (2,1,3) | (1,1,2) | (3,1,2) | (1,1,3) | (3,1,3) |
| (0,0,0) | (2,0,0) | (0,0,1) | (2,0,1) | (1,0,0) | (3,0,0) | (1,0,1) | (3,0,1) | | (0,1,0) | (2,1,0) | (0,1,1) | (2,1,1) | (1,1,0) | (3,1,0) | (1,1,1) | (3,1,1) |
| ⑥ | ② | ⑦ | ③ | ① | ⑤ | ③ | ⑦ | | ④ | ⓪ | ⑤ | ① | ② | ⑥ | ③ | ⑦ |

| (1, 2, 0) | (1, 2, 2) | (1, 2, 1) | (3, 2, 3) | (3, 2, 2) | (3, 2, 0) | (3, 2, 1) | (1, 3, 0) | (1, 3, 1) | (1, 3, 2) | (1, 3, 3) | (3, 3, 0) | (3, 3, 1) | (3, 3, 2) | (3, 3, 3) |
| --- | --- | --- | --- | --- | --- | --- | --- | --- | --- | --- | --- | --- | --- | --- |
| (1, 0, 0) | (1, 0, 1) | (1, 0, 2) | (3, 0, 3) | (3, 0, 2) | (3, 0, 0) | (3, 0, 1) | (1, 1, 0) | (1, 1, 1) | (1, 1, 2) | (1, 1, 3) | (3, 1, 0) | (3, 1, 1) | (3, 1, 2) | (3, 1, 3) |
| (0, 2, 0) | (0, 2, 1) | (0, 2, 2) | (2, 2, 3) | (2, 2, 2) | (2, 2, 1) | (2, 2, 0) | (0, 3, 0) | (0, 3, 1) | (0, 3, 2) | (0, 3, 3) | (2, 3, 0) | (2, 3, 1) | (2, 3, 2) | (2, 3, 3) |
| (0, 0, 0) | (0, 0, 1) | (0, 0, 2) | (2, 0, 3) | (2, 0, 2) | (2, 0, 1) | (2, 0, 0) | (0, 1, 0) | (0, 1, 1) | (0, 1, 2) | (0, 1, 3) | (2, 1, 0) | (2, 1, 1) | (2, 1, 2) | (2, 1, 3) |

FIG.14B

| x=0 | x=1 | x=2 | x=3 | x=0 | x=1 | x=2 | x=3 | x=0 | x=1 | x=2 | x=3 | x=0 | x=1 | x=2 | x=3 |
| --- | --- | --- | --- | --- | --- | --- | --- | --- | --- | --- | --- | --- | --- | --- | --- |
| y=2 | y=2 | y=2 | y=2 | y=0 | y=0 | y=0 | y=0 | y=3 | y=3 | y=3 | y=3 | y=1 | y=1 | y=1 | y=1 |
| y=2 | y=2 (z=1) | y=2 | y=2 | y=0 | y=0 (z=0) | y=0 | y=0 | y=3 | y=3 (z=3) | y=3 | y=3 | y=1 | y=1 (z=2) | y=1 | y=1 |
| y=2 | y=2 | y=2 | y=2 | y=0 | y=0 | y=0 | y=0 | y=3 | y=3 | y=3 | y=3 | y=1 | y=1 | y=1 | y=1 |
| y=2 | y=2 (z=1) | y=2 | y=2 | y=0 | y=0 (z=0) | y=0 | y=0 | y=3 | y=3 (z=3) | y=3 | y=3 | y=1 | y=1 (z=2) | y=1 | y=1 |

SEMICONDUCTOR STORING DEVICE

TECHNICAL FIELD

The present invention relates to a semiconductor storing device, and specifically relates to a semiconductor storing device that can access a plurality of addresses simultaneously.

BACKGROUND ART

A digital image output apparatus such as a digital color copier reads an image as data of R (red), G (green), and B (blue) via a reading unit of this apparatus. The digital image output apparatus outputs this data as the data of C (cyan), M (magenta), and Y (yellow) to a printing unit of this apparatus. Accordingly, in the image processing of the digital image output apparatus, coordinate conversion from a RGB color space to a CMY color space is performed on the image data. In this coordinate conversion process, it is necessary to take into account an input property of a scanner and an output property of a plotter, and converted coordinate values cannot be calculated in a simple manner. Conventionally, a three-dimensional lookup table (hereinbelow, referred to as LUT) is used. However, depending on a bit width of RGB data, a large capacity can be required to configure the LUT. For example, when R data, G data, and B data is represented by the widths of 8 bits, respectively, the bits of $2^8 \times 2^8 \times 2^8$ are required for the capacity of the LUT.

Conventionally, in order to reduce the capacity of the LUT, the color conversion process is performed as follows. A conventional configuration of a color conversion processing unit 90 is schematically shown in FIG. 15. This color conversion processing unit 90 includes a color conversion data memory area 91, and a correcting operation unit 92. C data, M data, and Y data that is formed by the upper 4 bits of R is written as addresses in the color conversion memory region in advance. C data, M data, and Y data that is formed by the upper 4 bits of G is written as addresses in the color conversion memory region in advance. C data, M data, and Y data that is formed by the upper 4 bits of B is written as addresses in the color conversion data memory area 91 in advance. As shown in FIG. 15, the three color conversion processing units 90 are prepared for the conversion to C data, the conversion to M data, and the conversion to Y data, respectively. Accordingly, the three color conversion data memory areas 91 in the respective color conversion processing units 90 correspond to the respective LUTs for the conversion to C data, the conversion to M data, and the conversion to Y data, respectively.

The upper 4-bit R data, the upper 4-bit G data, and the upper 4-bit B data out of the binary digit data of 8 bits read by a scanner (not shown) are used to read the data by using color conversion data memory areas 91. That is, at this time, one of the read data corresponds to a base address specified by the upper 4-bit data of R, G, and B, and the others of the read data correspond to predetermined addresses that are selected based on the base address. FIG. 16 shows one example of a plurality of addresses that are selected based on the base address (z, y, x) and are used for the data reading process.

When accessing a cyan memory area based on the base address (z, y, x) that is specified by the upper 4-bit data of R, G, and B, the base address indicated by "0" of FIG. 16 is selected, and a plurality of addresses (indicated by ① through ⑦ of FIG. 16 that are determined by adding "1" to one, two, and all of x, y, and z constituting the base address are selected. In other words, 8 addresses including the base address (z, y, x) that define one cube, for example, are selected, as shown in FIG. 16. The data that corresponds to the selected plural addresses is read from the cyan memory area. This read data is rough information because the read data is based on the upper 4-bit data of R data, G data, and B data.

Thereafter, in order to obtain fine information, the lower 4-bit data of R data, G data, and B data is used. The correcting operation unit 92 performs a correcting arithmetic operation by using the data. In this manner, the fine information about the cyan data that is included in the cube of FIG. 16 defined by the eight addresses can be obtained, and the data on which the color conversion is performed can be extracted.

In the same manner of obtaining the cyan data, the color conversion processing units 90 perform the color conversion process so as to obtain M data and Y data. The data corresponding to eight addresses is generally used, but the data corresponding to six addresses is also used in this field.

Generally, the above-described color conversion data memory area is formed by a plurality of RAMs. One example of the conventional RAM is shown in FIG. 17. In this example, the RAM is a static RAM, and a memory cell is selected by two stages, that is, by a word line and a division word line.

The RAM 100 includes a plurality of memory arrays 101 (1$^{st}$ block through a$^{th}$ block) having the same cell configuration. In each of the memory arrays 101, "c" number of word lines WL are respectively connected to division word lines DWL via division word line selectors 102. Memory cells whose number is "b" are connected to each of the division word lines DWL. Each of the memory cells 103 (MC) corresponds to one bit. At each column, the memory cells 103 are connected to a pair of bit lines BL and BLB so as to be located between the pair of bit lines BL and BLB. One end of each of the bit lines BL and BLB are connected to a pre-charging circuit 104. The bit lines BL and BLB are connected to a pair of data lines DL and DLB via a column gate 105. Each pair of data lines DL and DLB are connected to a data input/output circuit 108 via a sense operational amplifier 106 and a write buffer 107.

In the RAM 100, data is read from the memory cells 103 of each memory array 101, and data is written in the memory cells 103 of each memory array 101. This reading/writing operation is performed based on an address signal and a control signal that are sent to a row decoder 109 and a column decoder 110 from an address input circuit 111 and an internal control circuit 112. In other words, the address input circuit 111 and the internal control circuit 112 send the address signal and the control signal to the row decoder 109 and the column decoder 110 based on an external signals indicated by CEB, WEB, and ADD[h:0] in FIG. 17. The opening/closing of column gates 105 is controlled by selection signals G[a-1:0] output from the column decoder 110. At the time of the operation, the selection signals G[0] through G[a-1] as gate signals are one-by-one input to the 1$^{st}$ memory array through the a$^{th}$ memory array, respectively. One of the "a" number of the gate signals is made to rise so that only one of the "a" number of the memory arrays can be selected.

One division word line DWL to which "b" number of memory cells 103 are connected forms one word in each memory array 101. Accordingly, the RAM having such a configuration has a capacity of: a×c(words)×b(bits).

In FIG. 17, ADD[h:0] is shown as an input terminal of the address input circuit 111 ("h" is equal to or larger than "2").

However, three types of addresses X[i:0], Y[j:0], and Z[k:0] may be used as address input terminals. In this case, the address X is decoded by the row decoder 109, and the addresses Y and Z are decoded by the column decoder 110.

When all of "i", "j", and "k" are "1", "c" is "4", and "a" is "16". FIG. 18A shows one example of the address arrangement of the RAM having the storing area of "a×c" words. This RAM has respective blocks each of which forms one word. As shown in FIG. 18B, one block 115 corresponding to one word is configured so as to include one word line selector 102 and the division word line DWL having the "b" number of memory cells connected to this division word line DWL.

The addresses input from the address input terminals X[i:0], Y[j:0], and Z[k:0] are expressed by (z, y, x). In the case of simultaneously using the data corresponding to eight addresses that are made by adding "1" to one, two, and all of "x", "y", and "z" and that includes the base address (z, y, x) (refer to FIG. 16), the data corresponding to eight blocks indicated by "0" through "⑦" of FIG. 18A is simultaneously required. In this example, (z, y, x)=(00, 00, 01) indicates Z[1]=Z[0]=0, Y[1]=Y[0]=0, and X[1]=X[0]=1.

However, in the case of the RAM having the configuration shown in FIG. 17, the eight specified addresses correspond to blocks that are adjacent to each other, as shown in FIG. 18A. Furthermore, in this case, each pair of bit lines BL and BLB is shared by the blocks. Accordingly, the data corresponding to the eight addresses cannot be read simultaneously by one cycle. As one example, in order to simultaneously use the data corresponding to the eight addresses, eight RAMs are used, at the time of writing, the same data is written in the same address of each of the eight RAMs, and at the time of reading, data is output from the respective different addresses of the respective RAMs, for example. However, in this case, the entire chip area becomes large.

As another example, in order to use the data corresponding to the eight addresses, eight other RAMs each of which has one eighth of capacity of the RAM shown in FIG. 18A, i.e., has the capacity of a×c=4×2, are used. In FIG. 19A, the blocks 115 of FIG. 18A that are specified by the X address, the Y address, and Z address are respectively distributed to the eight RAMs each of which has a capacity of a×c=4×2. That is, by this address distribution, the blocks 115 of the eight addresses that are accessed simultaneously are distributed to the eight RAMs, respectively. In this example, "0" to "⑦" shown in FIG. 19A correspond to "0" to "⑦" shown in FIG. 18A. In order to simultaneously access the eight addresses of the eight RAMs such as "0" to "⑦" shown in FIG. 19A, a peripheral circuit external to the eight RAMs may decode the addresses, as shown in FIG. 19B.

With this configuration, it is possible to simultaneously use the data corresponding to the eight addresses without changing the total RAM capacity. However, in this case, the RAM is divided into eight block groups, so that each block group needs a specific control circuit. As a result, plural control circuits are used. In addition, a wiring area for the connection between the eight block groups and an external address decoder is required, so that the entire area becomes large.

Furthermore, in order to simultaneously access the eight addresses, "8×b" number of wires for transmitting and receiving data are required for the only input use, and this number of the wires for transmitting and receiving data increases by two times when taking into account the output use. Accordingly, the entire area becomes large.

In order to simultaneously access eight addresses, Japanese Laid-Open Patent Application No. 6-349268 discloses a semiconductor storing device that can perform one writing operation to simultaneously write data in a plurality of consecutive memory cells that belong to one row address and that are in an arbitrary range. Further, Japanese Laid-Open Patent Application No. 5-113928 discloses an image memory apparatus that converts an address, and can simultaneously access a plurality of memory cells either in the case of data of plural kinds of displaying elements corresponding to the same pixel or in the case of data of the same kind of displaying elements corresponding to plural pixels.

In these two prior techniques, it is possible to simultaneously access a plurality of addresses. However, the simultaneous access to a plurality of addresses is limited to one row address. Objects of these prior techniques are different from the object of the present invention which is to simultaneously access a plurality of addresses that are selected based on the base address (z, y, x).

DISCLOSURE OF THE INVENTION

It is an object of the present invention to provide a semiconductor storing device that enables a plurality of addresses to be accessed simultaneously without increasing a circuit area and a wiring area.

According to one aspect of the present invention, there is provided a semiconductor storing device in which a row of memory cells is selected by a word line stage and a division word line stage, comprising:

memory arrays that each include a plurality of memory cells arranged in a matrix;

word lines for respective rows of the memory cells;

division word lines each of which is connected to the memory cells arranged in one row corresponding to one word;

division word line selectors that select the division word lines, respectively, the division word lines being connected to the respective word lines via the division word line selectors, respectively;

pairs of bit lines for reading data from the memory cells and writing data to the memory cells that are connected to the pairs of the bit lines, respectively;

column gates connected to the pairs of bit lines, respectively;

pairs of data lines that are connected to the pairs of bit lines via the column gates, respectively, to communicate data;

write buffers for data writing that are connected to the pairs of data lines, respectively;

sense operational amplifiers for data reading that are connected to the pairs of data lines, respectively; and data input/output circuits that are connected to the pairs of data lines via the write buffers and the sense operational amplifiers, respectively, wherein input address data is specified by address data X[i:0], Y[j:0], and Z[k:0], two roots of selection signals for selecting the division word line selectors are provided alternately to the division word lines arranged in one of the memory arrays, and one of the two roots of the selection signals is enabled to select one of the division word line selectors in the one of the memory arrays, and eight roots of the selection signals in the entire semiconductor storing device are enabled so that when an address (z, y, x) is specified by the input address data X[i:0], Y[j:0], and Z[k:0], eight addresses of (z, y, x), (z, y, x+1), (z, y+1, x), (z, y+1, x+1), (z+1, y, x), (z+1, y, x+1), (z+1, y+1, x), and (z+1, y+1, x+1) are accessed simultaneously.

Four roots of selection signals for selecting the division word line selectors may be provided to the division word lines arranged in one of the memory arrays, and one of the four roots of the selection signals may be enabled to select one of the division word line selectors in the one of the memory arrays.

With this semiconductor storing device, it is possible to simultaneously access eight addresses in one RAM, and to decrease a circuit area and a wiring area compared with the conventional configuration.

According to another aspect of the present invention, four roots of the selection signals in the entire semiconductor storing device may be enabled so that when an address (z, y, x) is specified by the input address data X[i:0], Y[j:0], and Z[k:0], four addresses of (z, y, x), (z, y, x+1), (z, y+1, x), and (z, y+1, x+1) may be accessed simultaneously.

With this semiconductor storing device, it is possible to simultaneously access four addresses in one RAM, and to decrease a circuit area and a wiring area compared with the conventional configuration.

According to another aspect of the present invention, the semiconductor storing device further comprises selectors that are provided between the write buffers and the data input/output circuits, and between the sense operational amplifiers and the data input/output circuits, respectively such that the data input/output circuits always correspond one-to-one to the eight addresses of (z, y, x), (z, y, x+1), (z, y+1, x), (z, y+1, x+1), (z+1, y, x), (z+1, y, x+1), (z+1, y+1, x), and (z+1, y+1, x+1), respectively, and always transmit and receive, via the selectors, respective input data and output data corresponding one-to-one to the eight addresses, respectively.

With this semiconductor storing device, data input and data output corresponding to respective eight addresses that are determined based on the address (z, y, x) are assigned to respective data input/output circuits, so that it is not necessary to provide an additional external circuit, and an outside wiring area can be decreased.

According to another aspect of the present invention, when at least one of z, y, and x of the address (z, y, x) is an allowable maximum value, at least one of z+1, y+1, and x+1 that corresponds to the at least one of x, y, and z having the allowable maximum value is converted to "0" to access the eight addresses simultaneously.

With this semiconductor storing device, it is possible to decrease a circuit area and a wiring area.

According to another aspect of the present invention, the semiconductor storing device further comprises selection means for selecting either a first mode in which the eight addresses are accessed simultaneously, or a second mode in which a single address is accessed.

With this semiconductor storing device, when only one address is rewritten, it is not necessary to prepare the same data as the data already written in the other addresses in order to prevent the data of the other addresses from being changed.

BRIEF DESCRIPTION OF THE DRAWINGS

FIG. 2 shows address arrangement for memory arrays of a×c=16×4 where address value "00" is converted to "0", the address value "01" is converted to "1", the address value "10" is converted to "2", and the address value "11" is converted to "3" to express the address (z, y, x) that is determined by X[1:0], Y[1:0], and Z[1:0].

FIG. 3A shows one example of address arrangement according to the first embodiment where one address is selected for every two lateral blocks.

FIG. 3B shows the address arrangement of FIG. 3A by another expression.

FIG. 4A shows access positions in the address arrangement of FIG. 3A when a base address (z, y, x) is (0, 0, 0).

FIG. 4B shows access positions in the address arrangement of FIG. 3A when a base address (z, y, x) is (1, 1, 0).

FIG. 4C shows access positions in the address arrangement of FIG. 3A when a base address (z, y, x) is (2, 2, 1).

FIG. 4D shows access positions in the address arrangement of FIG. 3A when a base address (z, y, x) is (1, 1, 1).

FIG. 7 shows address arrangement related to a conventional RAM.

FIG. 8 shows one example of address arrangement for the RAM of FIG. 1.

FIG. 14A shows an example of address arrangement according to a sixth embodiment of the present invention.

FIG. 14B shows the address arrangement of FIG. 14A by another expression.

BEST MODE FOR CARRYING OUT THE INVENTION

Embodiments of the present invention will be described with reference to the drawings.

Figure 1:
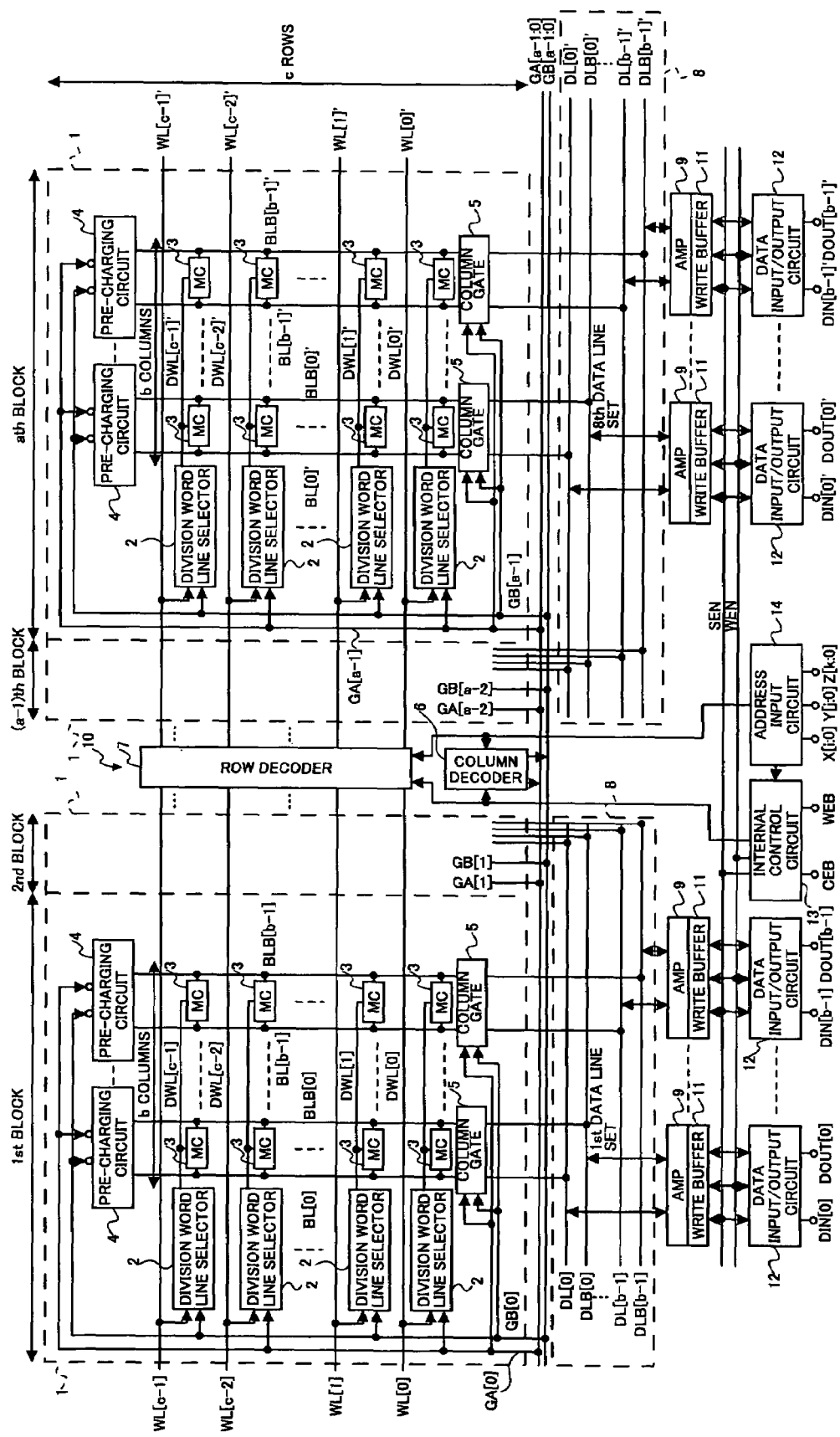
FIG. 1 schematically shows a RAM configuration according to a first embodiment of the present invention.

FIG. 1 is a block diagram schematically showing a RAM 10 according to a first embodiment of the present invention. The RAM 10 includes a plurality of memory arrays 1 (corresponding to $1^{st}$ block through $a^{th}$ block) having the same cell configuration. In each memory array 1, the "c" number of word lines WL are connected to division word lines DWL, respectively via division word line selectors 2. The "b" number of memory cells 3 (MC) that form one word are connected to each of the division word lines DWL. At each column address, the memory cells 3 are connected to a pair of bit lines BL and BLB so as to be located between the bit lines BL and BLB. One ends of the bit lines BL and BLB are connected to a pre-charging circuit 4.

Respective pairs of the bit lines BL and BLB are connected via respective column gates 5 to respective pairs of data lines DL and DLB. $1^{st}$ through $8^{th}$ data line sets 8 having these pairs of data lines are arranged as shown in FIG. 1. Each pair of the data lines DL and DLB is connected via a sense operational amplifier 9 and a write buffer 11 to a data input/output circuit 12.

In the RAM 10, in accordance with an external signal, an address signal and a control signal for the memory cells 3 of each memory array 1 are sent from an address input circuit 14 and an internal control circuit 13 to a row decoder 7 and a column decoder 6. In this manner, various operations such as data reading from the memory cell 3 in each memory array 1 and the data writing to the memory cell 3 in each memory array 1 are controlled based on the address signal and the control signal.

In this example, three types of address data. i.e., address data X[[1:0], Y[1:0], and Z[1:0] (also referred to as X, Y, and Z) is input to input terminals of the address input circuit 14, the row decoder 7 decodes the address data X and the address data Y, and the column decoder 6 decodes the address data X and the address data Z.

Figure 18A:
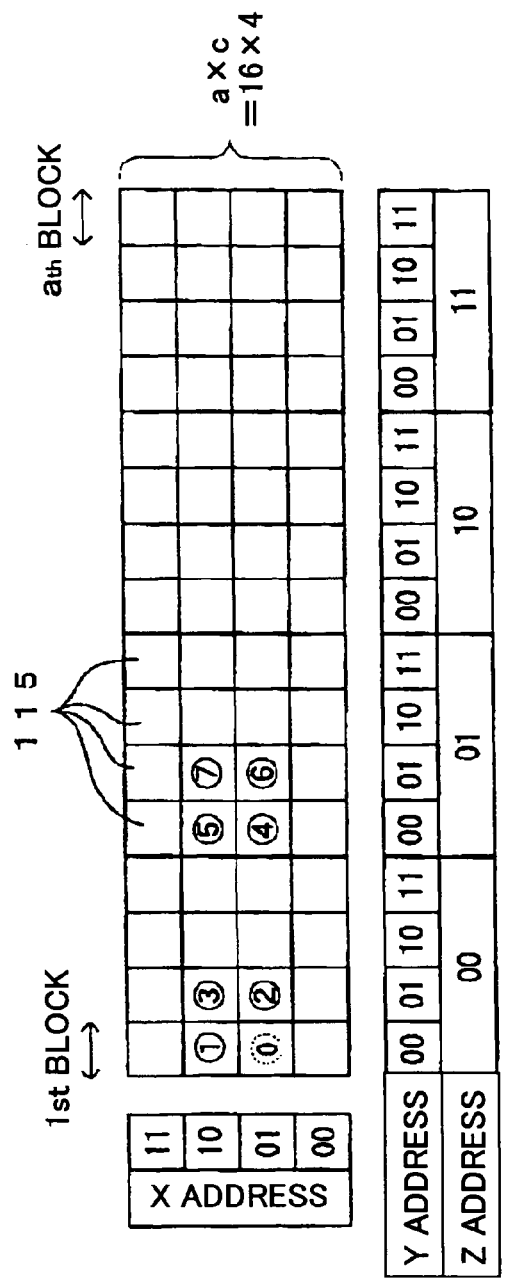
FIG. 18A shows an example of address arrangement of memory arrays having a memory area of (a×c) words in the related art.
Figure 18B:
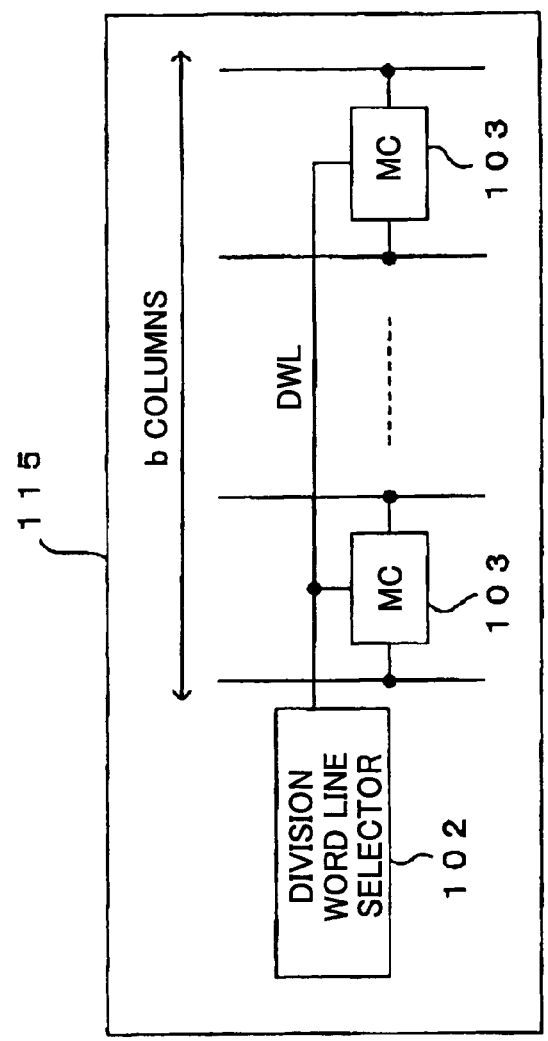
FIG. 18B shows one block corresponding to "b" bits in the memory arrays of FIG. 18A.

As in the address arrangement of FIG. 18A, FIG. 2 shows the address arrangement in the case of X[1:0], Y[1:0], and Z[1:0]. In this address arrangement of FIG. 2, the address value "00" is converted to "0" the address value "01" is converted to "1", the address value "10" is converted to "2", and the address value "11" is converted to "3". In FIG. 2, the blocks on which the oblique lines rising at the left side are drawn correspond to the eight addresses that are selected based on the base address (z, y, x)=(1, 1, 1) in the same manner shown in FIG. 16. In order to simultaneously read data from these eight addresses, it is necessary to access the eight addresses of the blocks on which the oblique lines are drawn.

Figures 3A, 3B:
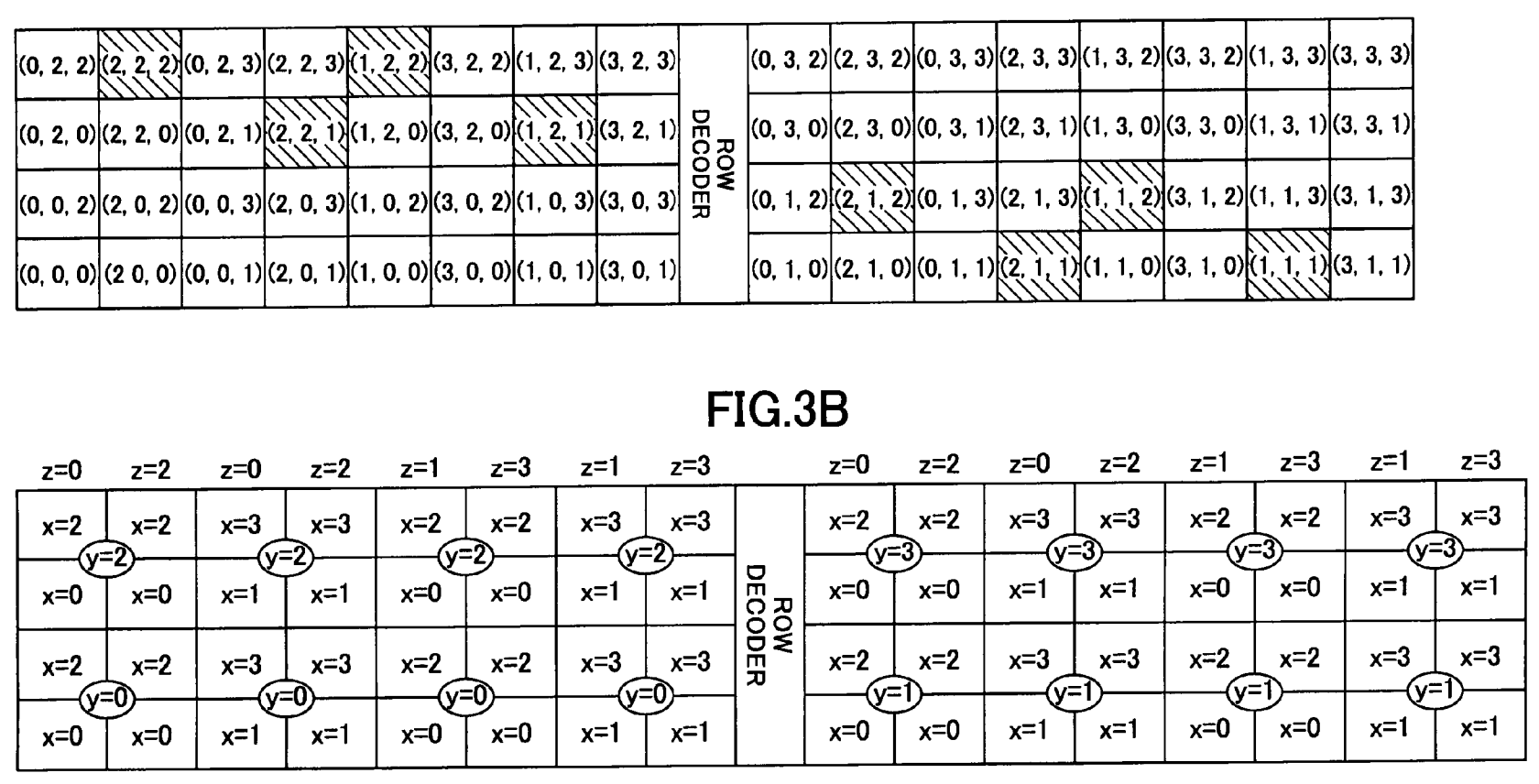

In order to achieve the object of the present invention, the memory cells 3 belonging to the eight selected addresses on which the reading operation is simultaneously performed should not share the pair of the bit lines BL and BLB. For this reason, the address arrangement of FIG. 2 is changed to the address arrangement of FIG. 3A, for example. There are several patterns for distributing the addresses, but in the address arrangement shown in FIG. 3A, one address is selected from every two blocks with respect to the lateral direction of FIG. 3A. As in the example of FIG. 2, the blocks of FIG. 3A on which the oblique lines rising at the left side are drawn correspond to the eight addresses that are selected based on the cube shown in FIG. 16. In FIG. 3B, the same address arrangement as that of FIG. 3A is shown in another manner.

In FIGS. 4A through 4D, examples of the distribution of the eight selected address are shown in the case of the base addresses of these figures that are different from each other. FIGS. 4A, 4B, 4C, and 4D correspond to the base address (z, y, x)=(0, 0, 0), (1, 1, 0), (2, 2, 1), and (1, 1, 1), respectively. In each of FIGS. 4A through 4D, 0 through ⑦ correspond to 0 through ⑦ shown in FIGS. 16 and 18A. As understood from FIGS. 4A through 4D, the positions of accessed addresses are roughly classified into two types.

Figures 4C, 4D:
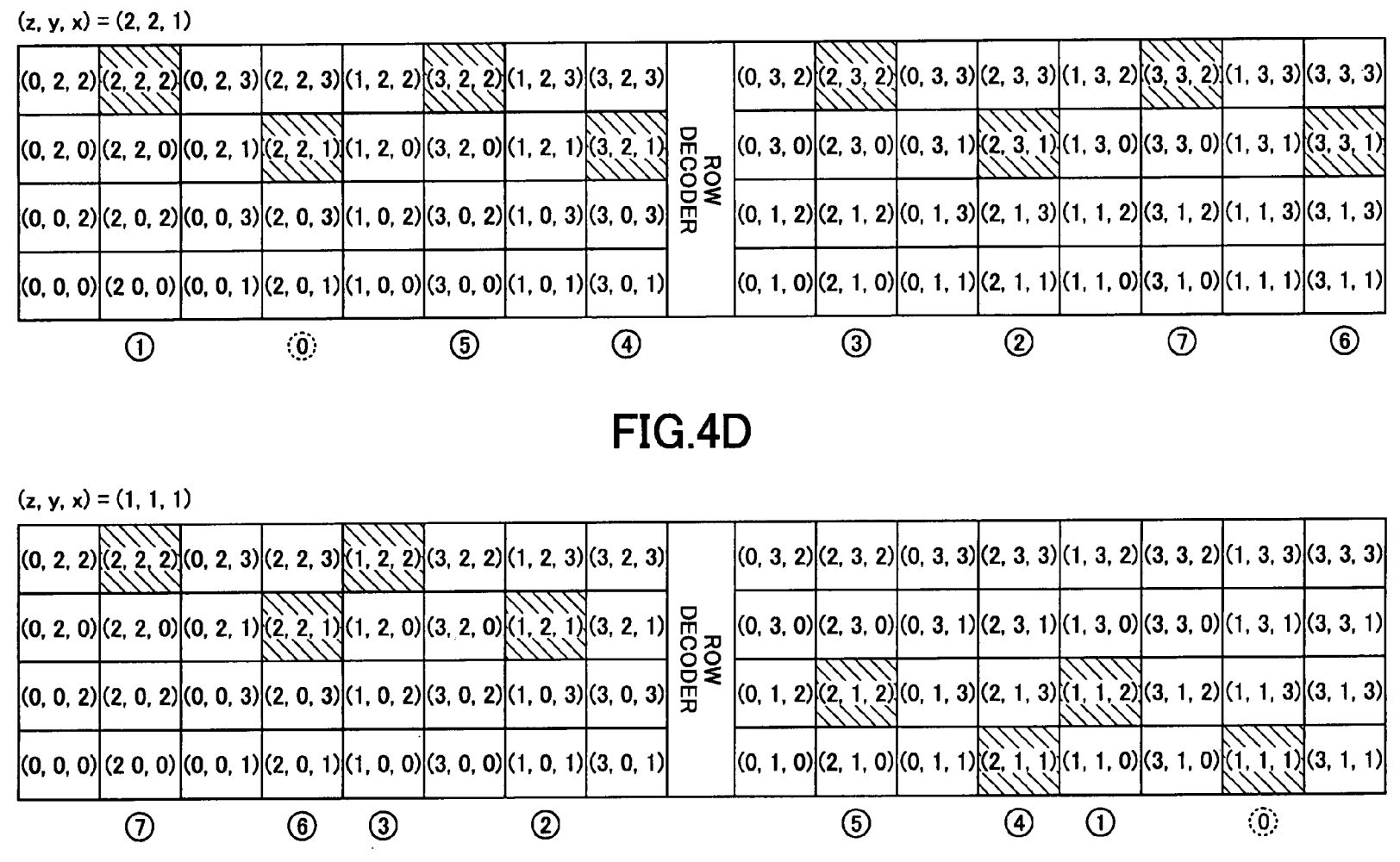

In FIGS. 4A and 4B, at each of the right and left sides of the row decoder, the addresses that are accessed are arranged in the same row, so that one word line WL needs to rise at each of the right and left sides of the row decoder. On the other hand, in FIGS. 4C and 4D, at each of the right and left sides of the row decoder, the addresses that are accessed are arranged in different rows. To be specific, in FIG. 4C, at each of the right and left sides of the row decoder, the addresses are arranged in two upper rows. In FIG. 4D, at the left side of the row decoder, the addresses are arranged in two upper rows, and at the right side of the row decoder in FIG. 4D, the addresses are arranged in two lower rows. In the case of FIGS. 4C and 4D, two word lines WL need to rise at each of the right and left sides of the row decoder.

Figure 17:
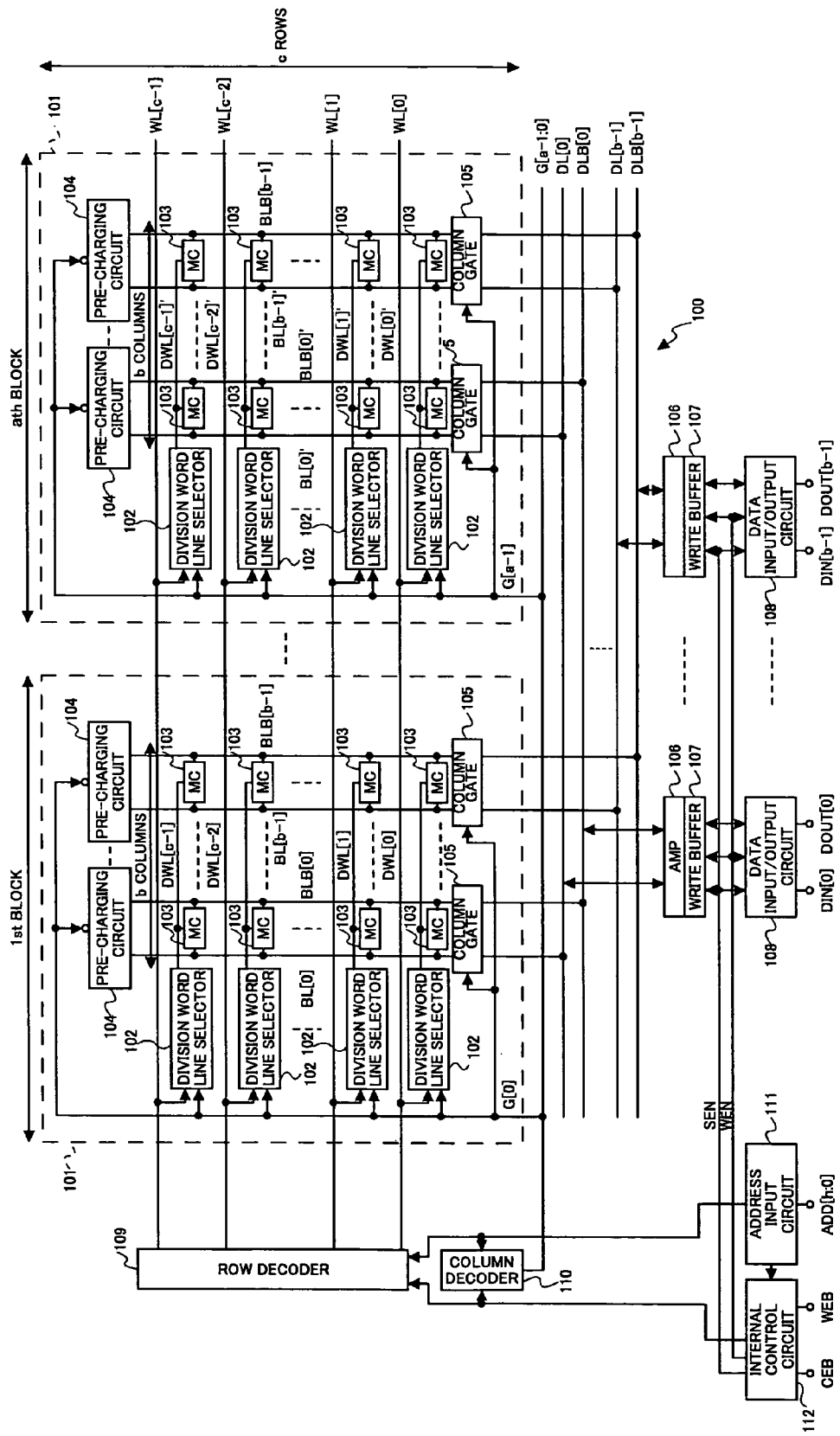
FIG. 17 shows a RAM in the related art.

In the case of the conventional RAM as shown in FIG. 17, when two word lines WL that are located at the same side of the row decoder rise simultaneously, and the selection signals G[a-1:0] of the division word lines 102 are enabled, the two division word lines DWL are made to rise simultaneously in one memory array 101. Accordingly, there is a problem in that the data collides with each other via the pair of the bit lines BL and BLB. In order to solve this problem, according to the first embodiment of the present invention, as shown in FIG. 1, two types of roots GA and GB regarding selection signals GA[a-1:0] and GB[a-1:0] for the division word line selectors 2 are used, and are alternately connected row by row to the division word line selectors 2 arranged in the longitudinal direction. With this configuration, at each memory array 1, one of the roots GA and GB regarding the selection signals GA[a-1:0] and GB[a-1:0] is made to rise, or neither of the roots GA and GB regarding the selection signals GA[a-1:0] and GB[a-1:0] is made to rise. In this manner, it is possible to avoid the collision of the data even if the two word lines WL are simultaneously made to rise at one side of the row decoder.

In the case of the RAM 10 shown in FIG. 1, the eight sets of the data lines DL and DLB are arranged. This arrangement of the data lines DL and DLB is applied to the address arrangement where one address is selected from the blocks arranged in the lateral direction, as shown in FIG. 3A. In this example, the memory cells 3 positioned at the respective "b" number of columns are connected to each division word line DWL, and if a=16, the memory cells 3 corresponding to the two blocks are connected to each set of the data lines DL and DLB. Furthermore, the sense operational amplifiers 9 and the write buffers 11 corresponding to the "b" bits are also connected to each set of the data lines DL and DLB.

When either GA or GB regarding the selection signal GA[a-1:0] and the selection signal GB[a-1:0] output from the column decoder 6 is made to be enabled, the column gate 5 releases a gate between the pair of the bit lines BL and BLB and the pair of the data lines DL and DLB. When both the selection signal GA[a-1:0] and the selection signal GB[a-1:0] are disabled, the pre-charging circuit 4 pre-charges the pair of the bit lines BL and BLB. In one memory array 1, the column decoder 6 causes the type GA regarding the selection signal roots GA[a-1:0] or the type GB regarding the selection signal roots GB[a-1:0] to be enabled in accordance with the address values (z, y, x). The enabled selection signal roots (i.e., selection signals) out of GA[a-1:0] and GB[a-1:0] are input to the blocks including the eight accessed addresses that are selected out of the $1^{st}$ through $a^{th}$ blocks. The row decoder 7 causes one word line WL at each side of the row decoder 7 or two word lines WL at each side of the row decoder 7 to rise in accordance with the address values (z, y, x).

In the first embodiment, the row decoder 7 is positioned at the center part of the RAM 10. That is, each side of the row decoder 7 has the same number of the memory arrays 1. In this example, if all of the memory arrays 1 are arranged at one side of the row decoder 7, the four word lines WL at most need to rise, and only the selection signal types of roots GA and GB regarding the selection signal roots GA[a-1:0]

and the selection signal roots GB[a-1:0] do not avoid the data collision on the bit lines. In order to avoid this data collision, the row decoder 7 is positioned at the center part of the RAM 10, as shown in FIG. 1. If the column decoder 6 is connected to each of the all memory arrays 1 of FIG. 1, the row decoder 7 needs not to be positioned at the center part of the RAM 10.

Figure 5:
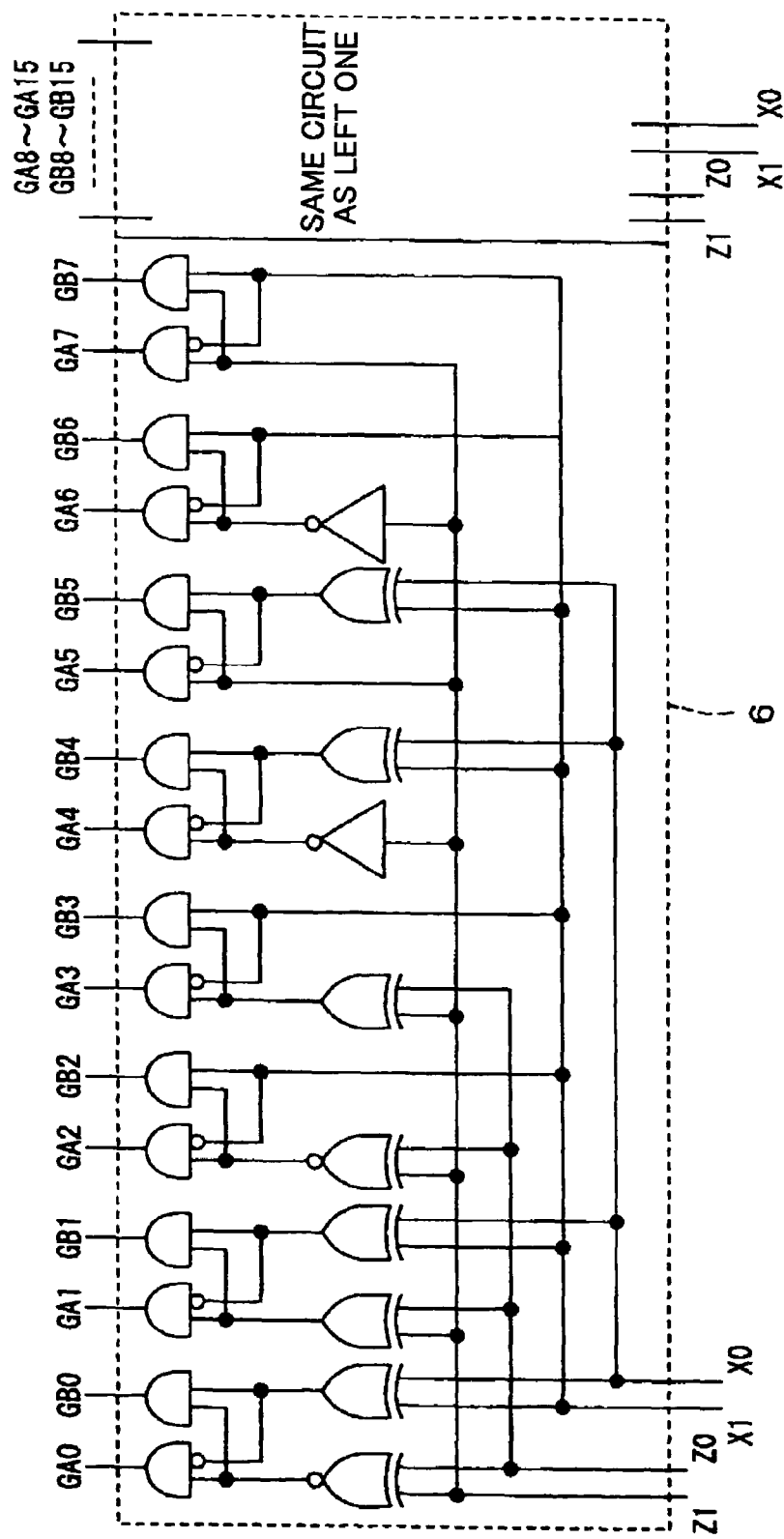
FIG. 5 shows an internal configuration of a column decoder.
Figure 6:
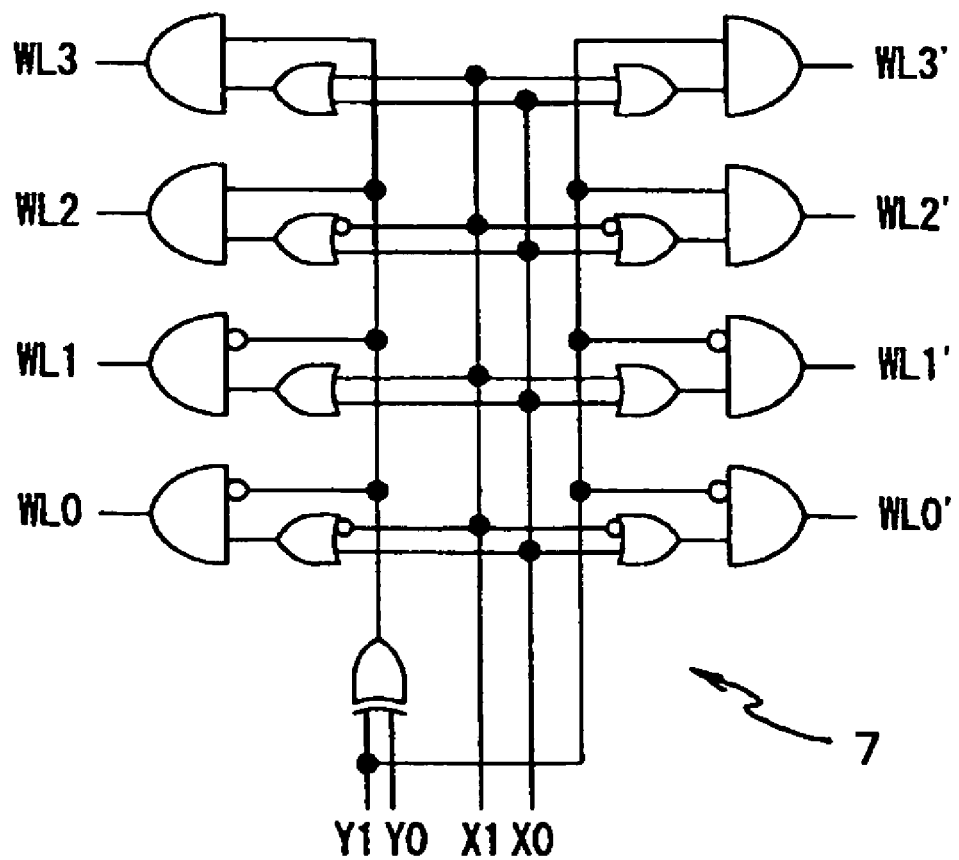
FIG. 6 shows an internal configuration of a row decoder.

An example of a circuit configuration of the column decoder 6 for the address arrangement of FIG. 3A is shown in FIG. 5, and an example of a circuit configuration of the row decoder 7 for the address arrangement of FIG. 3A is shown in FIG. 6. In this example, it is assumed that "a" is "16", and "c" is "4". In these circuit configurations, the address inputs X[1:0] and Y[1:0] are decoded by the column decoder 6, and the address input Z[1:0] is decoded by the row decoder 7.

Figure 7:
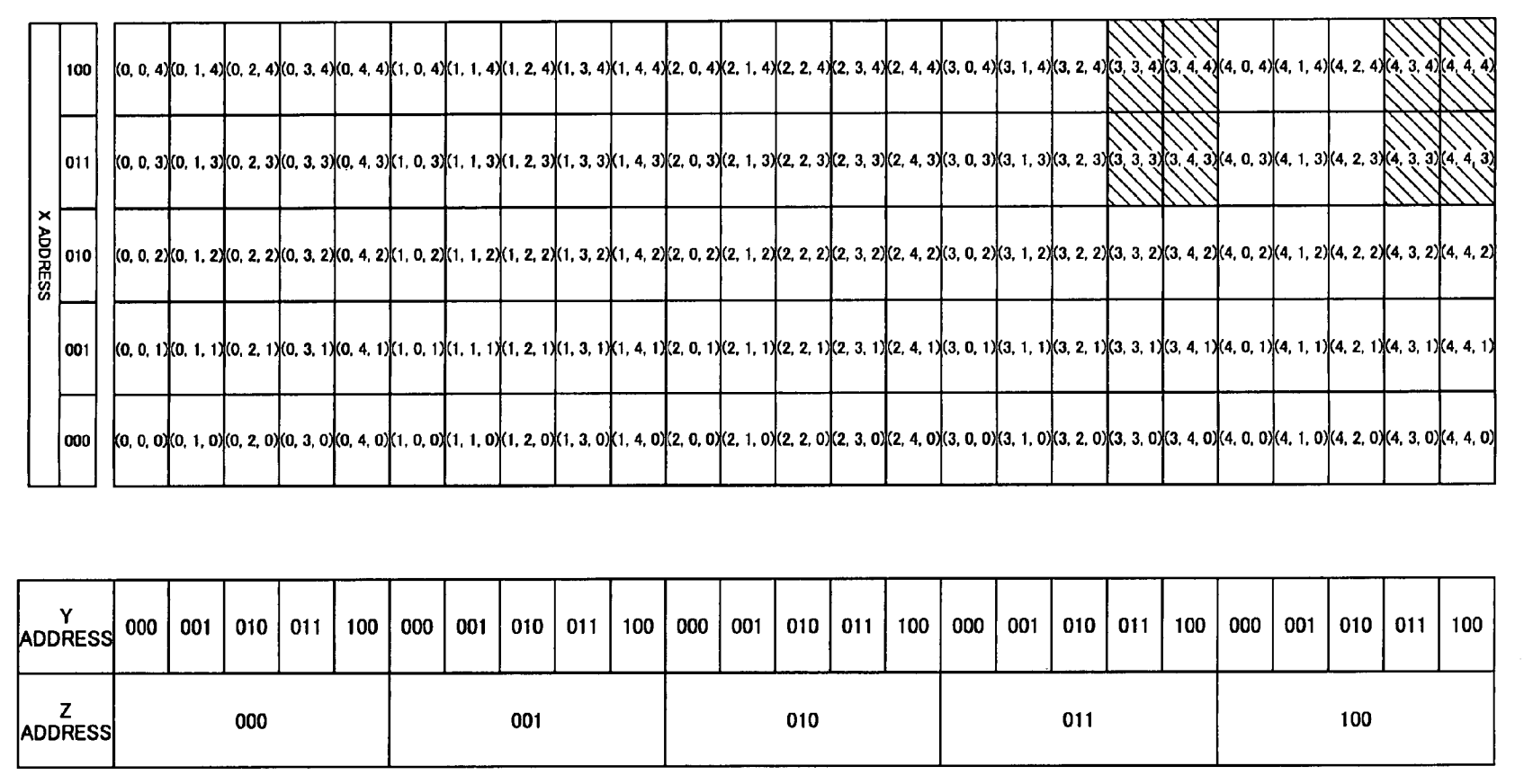
Figure 8:
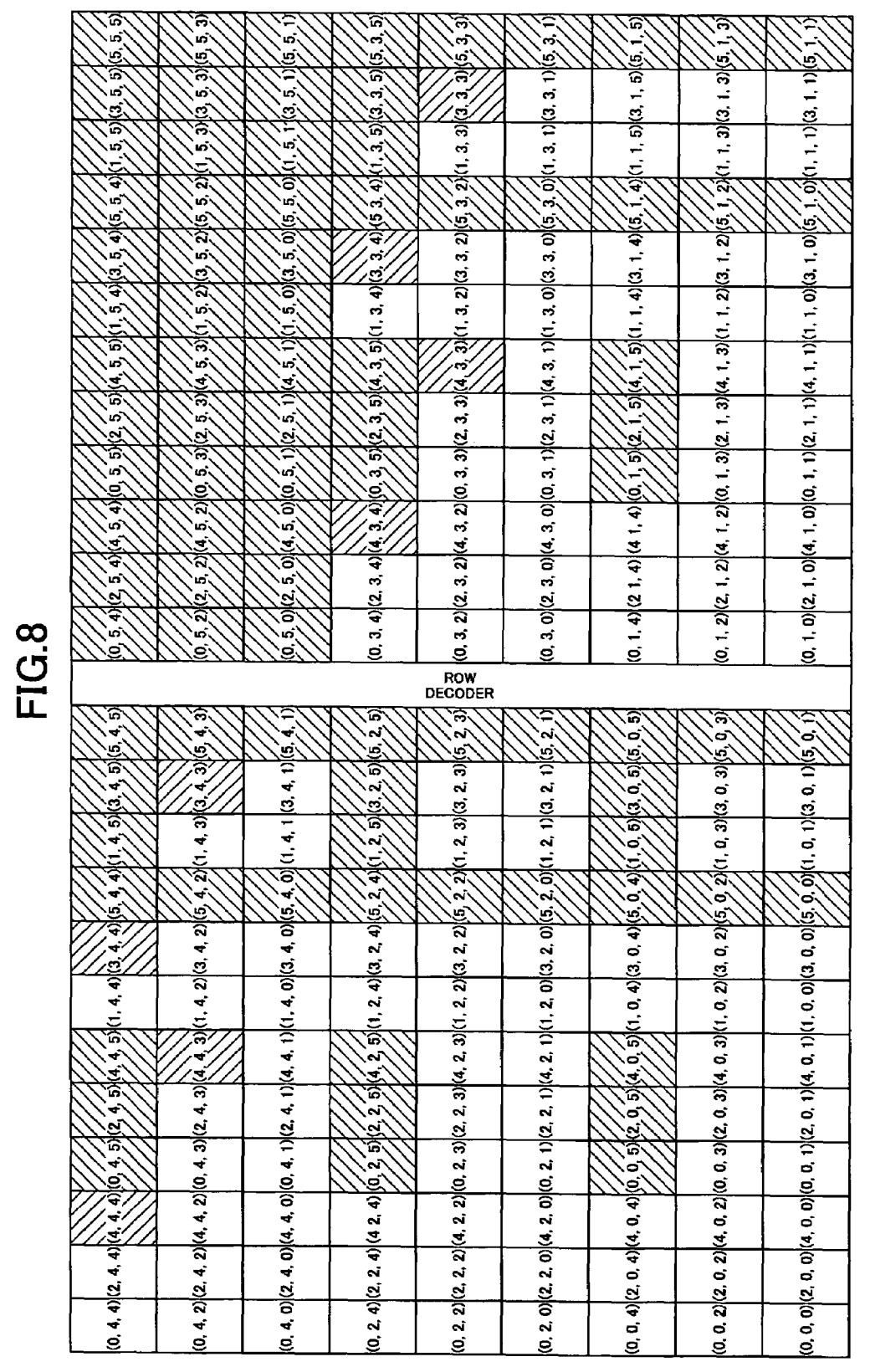
Figure 9:
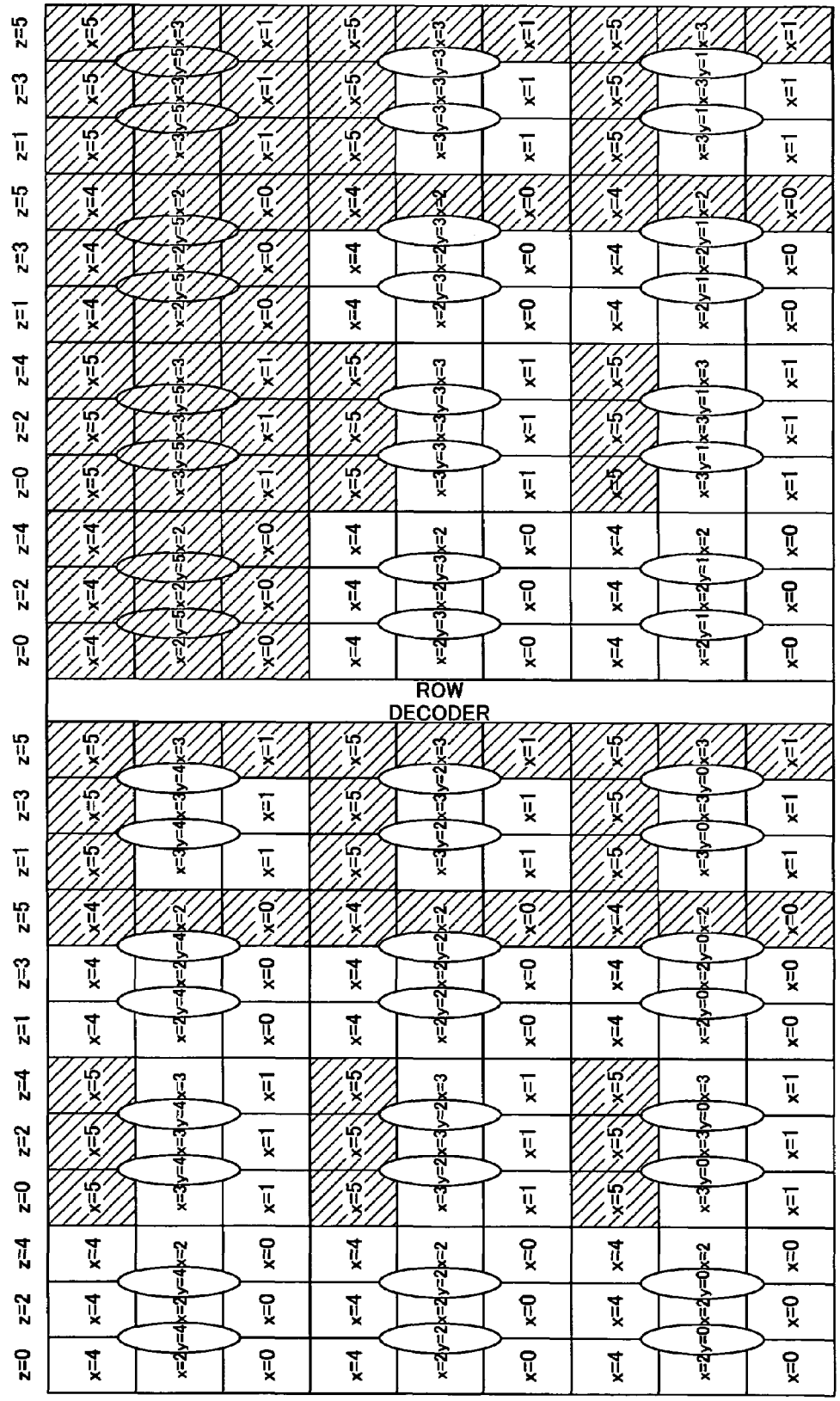
FIG. 9 shows the address arrangement of FIG. 8 by another expression.

In FIGS. 3A and 3B, and 4A through 4D, the values of z, y, and x of the base address (z, y, x) are equal to or smaller than "2". In the example of FIGS. 7 through 9, one of z, y, and x of the base address (z, y, x) is "3". An example of the address arrangement of from (0, 0, 0) to (4, 4, 4) is shown in FIG. 7 (FIG. 7 shows the address arrangement related to the conventional RAM 100 of FIG. 17). In this case, three input address data X[2:0], three input address data Y[2:0], and three input address data Z[2:0] is required, and address value conversion is performed such that "000" is converted to "0", "001" is converted to "1", "010" is converted to "2", "011" is converted to "3", and "100" is converted to "4", in order to express the address by (z, y, x). In FIG. 7, the blocks on which the oblique lines rising at the left side are drawn correspond to the eight addresses that are selected based on the base address (z, y, x)=(3, 3, 3) in the manner shown in FIG. 16.

Similar to the case of FIG. 18A, in the case of FIG. 7, each group of the four selected addresses correspond to the blocks that are adjacent to each other. Every two blocks at the same column share the pair of the bit lines BL and BLB, so that the data corresponding to the eight addresses cannot be read during one cycle.

FIG. 8 (related to the first embodiment of the present invention) shows an alternative example of the address arrangement of FIG. 7. In FIG. 8, the blocks on which the oblique lines rising at the left side are drawn correspond to the eight addresses that are selected based on the base address (z, y, x)=(3, 3, 3) in the same manner of FIG. 16. In this example of FIG. 8, "a" of FIG. 1 is "24", and "c" of FIG. 1 is "9". Furthermore, as shown in FIG. 8, three blocks including division word lines arranged in one memory array 1 are connected to each data line set 8. In order to form the address arrangement that enable plural addresses to be accessed simultaneously, this address arrangement needs to include blocks (indicated by the oblique lines rising at the right side) corresponding to the address value of "5" that is not necessary. The address value of "5" is the value converted from the address "101" of X, Y, or Z. In practical use, the addresses having the address value of "5" are not accessed, and the columns where the address value z is 5 can be omitted from the layout.

The address arrangement of FIG. 8 is shown in FIG. 9 by another expression. As described above, the address arrangement of FIG. 7 needs three input address data X[2:0], three input address data Y[2:0], and three input address data Z[2:0]. On the other hand, in the address arrangement of FIGS. 8 and 9, when the base address (z, y, x) (i.e., the address corresponding to "0" of FIG. 16) has the address values ranging from (0, 0, 0) to (3, 3, 3), it is possible to access the addresses corresponding to the required address values ranging from (0, 0, 0) to (4, 4, 4). Therefore, in the example of FIGS. 8 and 9, two input address data X[1:0], two input address data Y[1:0], and two input address data Z[1:0] suffice.

Figure 19A:
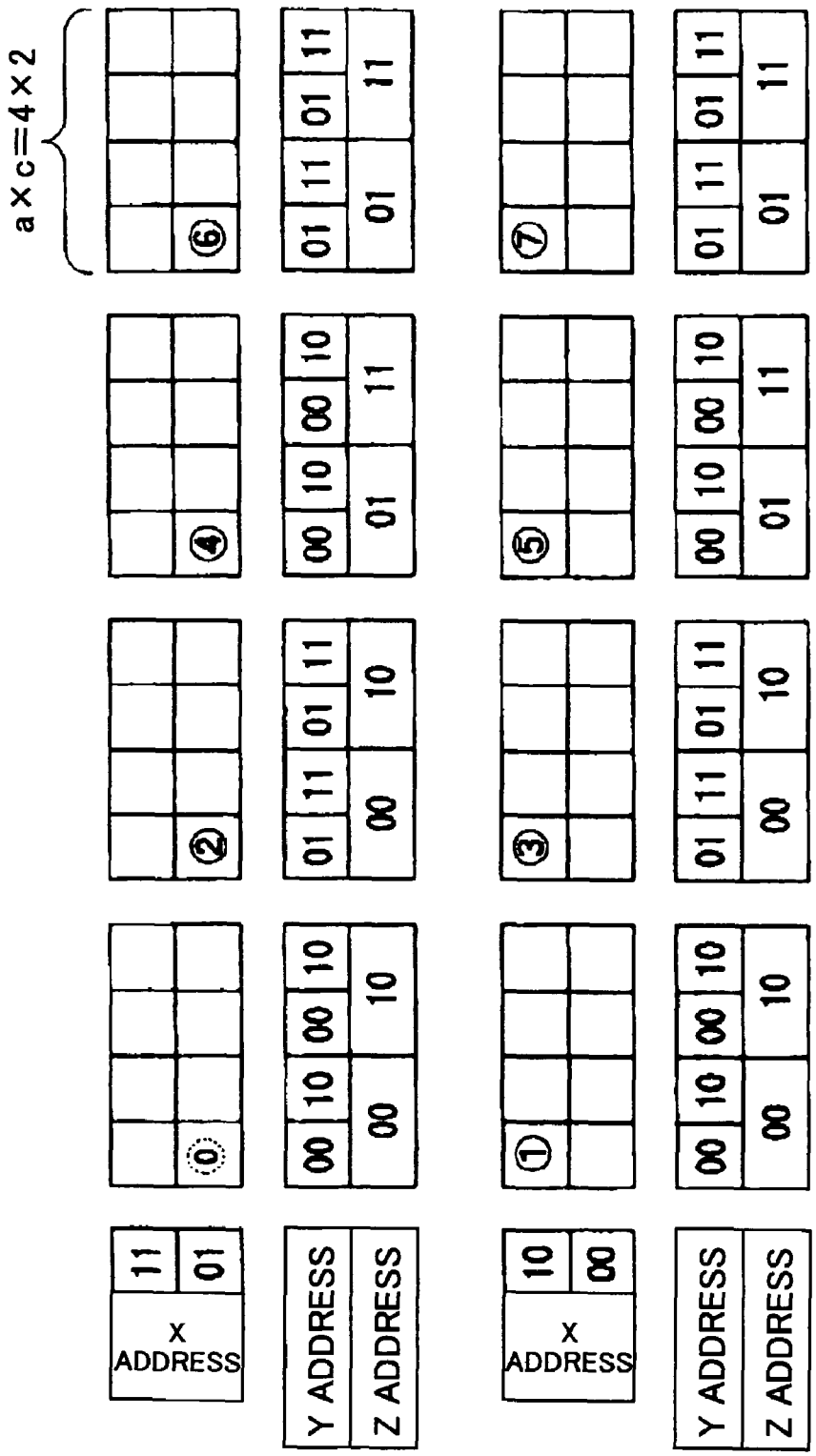
FIG. 19A shows an example of address arrangement in a RAM including eight regions each of which has an area of (a×c=4×2) in the related art.
Figure 19B:
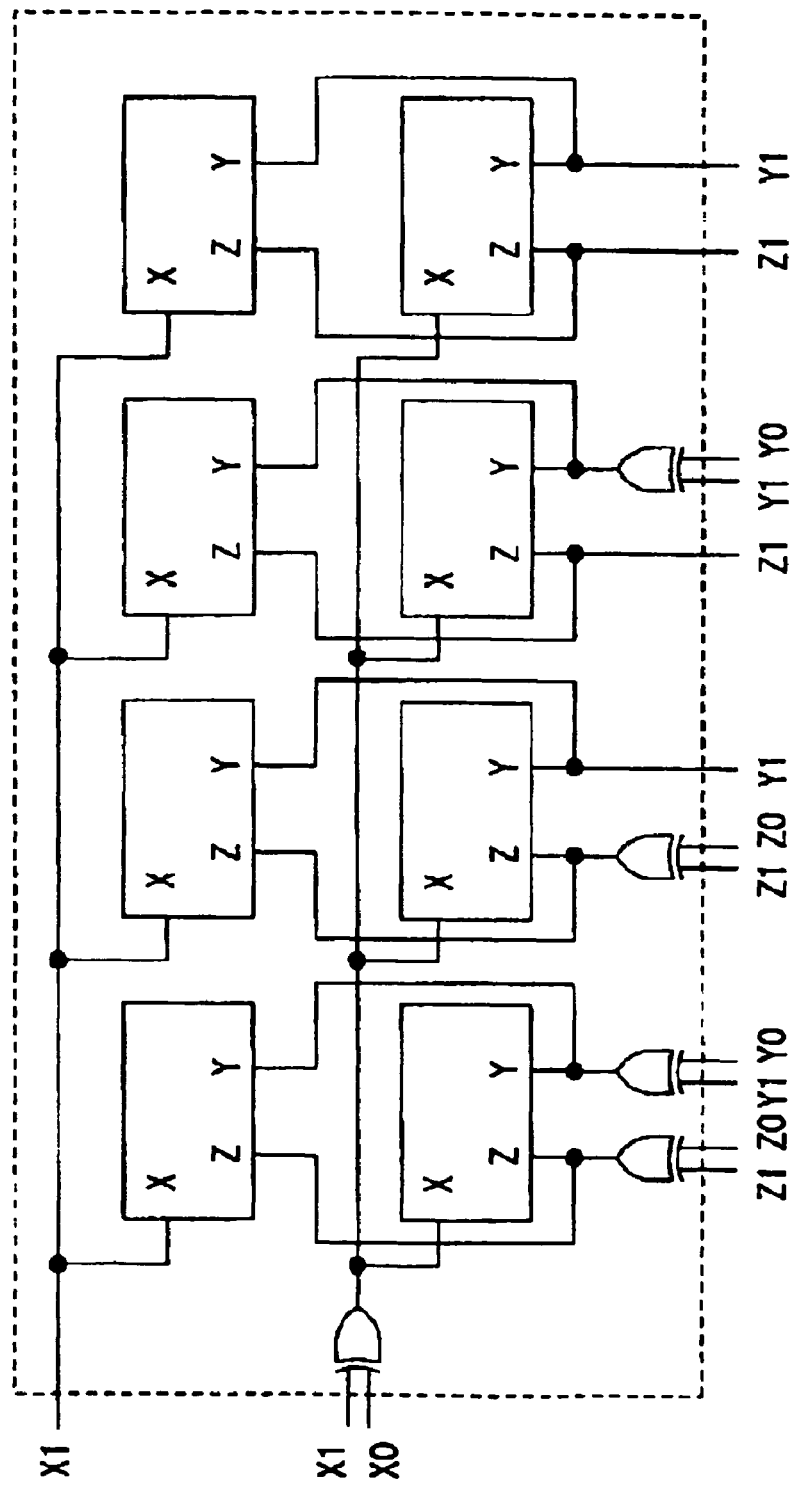
FIG. 19B schematically shows a circuit configuration of the RAM shown in FIG. 19A.

The area of the address arrangement shown in FIG. 8 is larger than the area of the address arrangement shown in FIG. 7. However, in the case of using eight RAMs (memory arrays) each of which has a part of the entire capacity, the address arrangement of FIG. 7 cannot be divided into eight parts each having the same capacity as described above by referring to FIGS. 19A and 19B, and the RAM (memory array) having one eighth of this entire capacity of FIG. 7 is not available. For this reason, it is necessary to use RAMs (memory arrays) that each have a capacity larger than one eighth of the entire capacity. Furthermore, when a wiring area is taken into account, the entire area required for the address arrangement shown in FIG. 8 becomes smaller than the entire area required for the address arrangement shown in FIG. 7. Accordingly, the address arrangement of FIG. 8 is more advantageous in terms of the entire area.

According to the RAM of the first embodiment having the above-described configuration, it is possible to access eight addresses simultaneously, that is, it is possible to read data from or write data to the eight addresses simultaneously. When this RAM is actually configured, the circuit area and the wiring area of this RAM is not increased.

Figure 16:
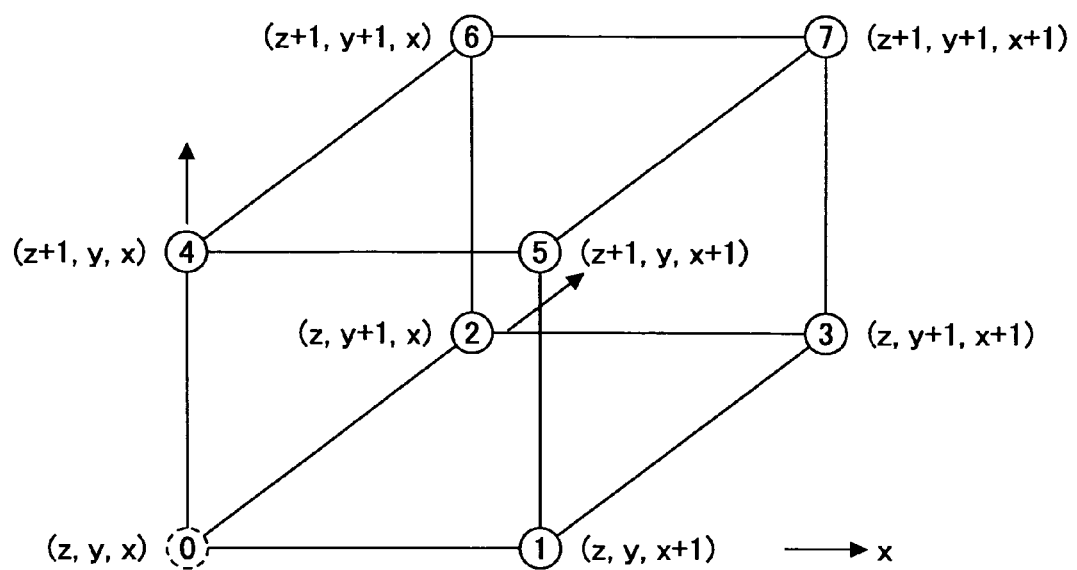
FIG. 16 is an illustration for address selection in which a plurality of addresses for data accessing are selected based on a base address.

Other embodiments of the present invention will be described, and in the following, the same reference numbers of the first embodiment are attached to the same parts as those of the first embodiment Next, a second embodiment of the present invention will be described. The blocks to which eight addresses determined based on the cube of FIG. 16 are assigned change, depending on the base address values (z, y, x). This change of the assigned blocks can be seen from the difference in the selected blocks of FIGS. 4A through 4D as indicated by "0" through "⑦" of FIGS. 4A through 4D. In the configuration of the RAM 10 shown in FIG. 1, data corresponding to the address (z, y, x) is input to or output from predetermined "b"-bit data input/output circuits 12 (for example, positioned at the lower and most left part of FIG. 1), the data corresponding to the address (z, y, x+1) is input to or output from the same predetermined "b"-bit data input/output circuits 12 on another occasion, and other data corresponding to the other addresses is input to or output from the same predetermined "b"-bit data input/output circuits 12 on other occasions, in accordance with the values of the base address (z, y, x). However, in this condition, using this RAM 10 is not convenient.

Figure 10:
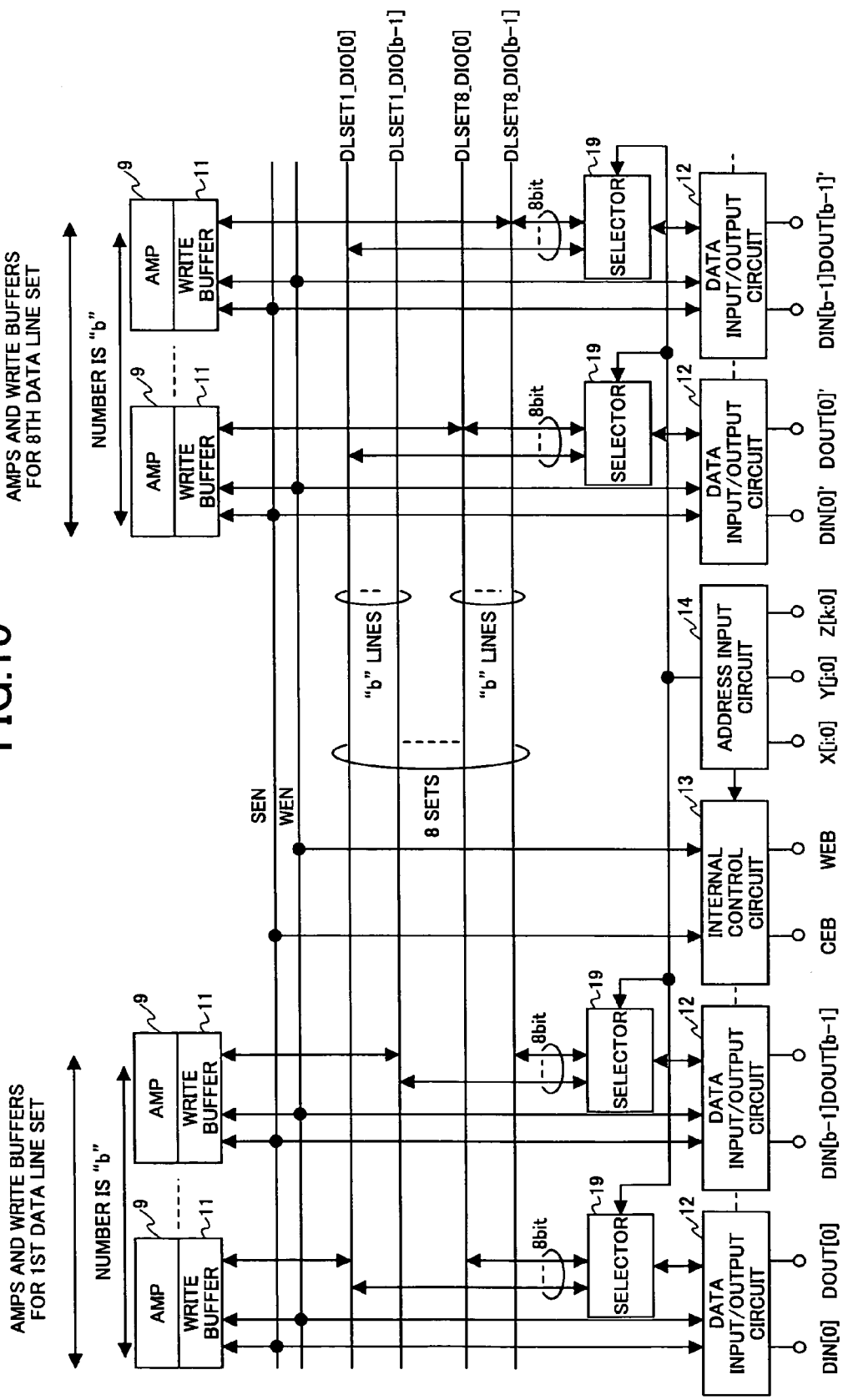
FIG. 10 shows a part of a RAM according to a second embodiment of the present invention.

According to the second embodiment of the present invention, eight sets of buses DLSET_DIO are arranged between the sense operational amplifier 9/the write buffer 11 and the data input/output circuit 10 as shown in FIG. 10 in order to solve this inconvenience. Each set of buses DLSET_DIO includes "b" number of signal lines. Further, a selector 19 is arranged between each data input/output circuit 12 and the buses DLSET_DIO. Based on the input from the address input circuit 12, the selector 19 selects the data corresponding to a predetermined address, and allows the selected data to pass the selector 19. With this configuration, the data corresponding to the address (z, y, x) is always input to or output from a certain group corresponding to the "b" number of the data input/output circuits 12, and the data corresponding to the address (z, y, x+1) is always input to or output from another group of the "b" number of the data input/output circuits 12. As for other groups of the "b" number of the data input/output circuits 12, the data corresponding to a predetermined address is input to or output from a predetermined group of the "b" number of the data input/output circuits 12.

Next, a third embodiment of the present invention will be described. When it becomes necessary to rewrite the data of a single address in the RAM shown in FIG. 1 in which the data of the eight addresses can be read and written simultaneously, it is necessary to always prepare the data corresponding to the eight addresses, input the data for rewriting in this single rewriting address, and to input the data for the other seven addresses that each corresponds to the data already written in the other seven addresses, in order to prevent the data already written in the other seven addresses from being changed. In order to solve this trouble, according to the third embodiment of the present invention, there is provided a selection terminal that enables the operation mode to be selected from a first operation mode for simultaneously reading or writing the data of eight addresses and a second mode for reading or writing the data of a single address.

Figure 11:
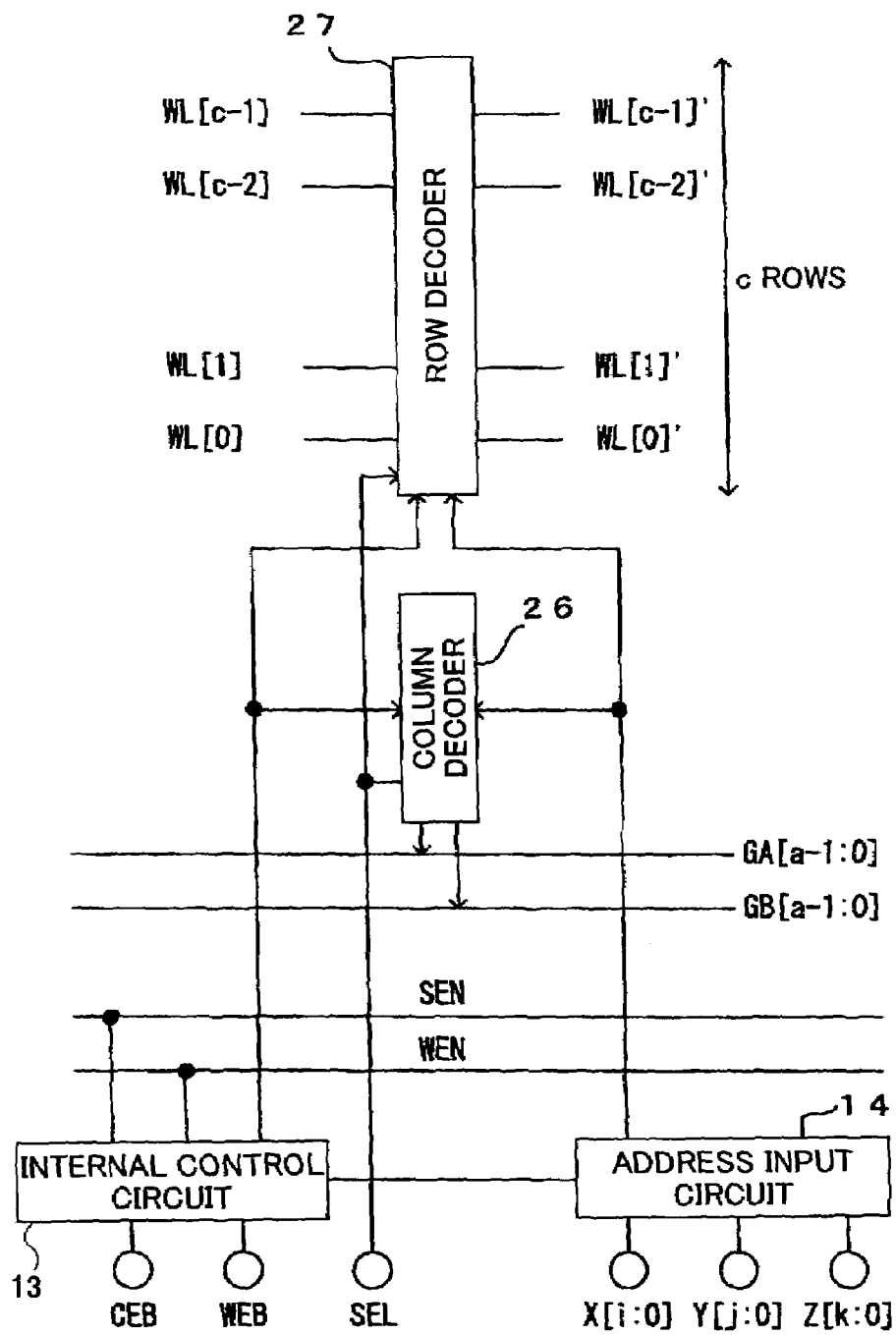
FIG. 11 shows a part of a RAM having a selection signal line of the third embodiment.

FIG. 11 shows a configuration where the selection terminal SEL is added to the configuration shown in FIG. 1, according to the third embodiment of the present invention. For simplicity, only the internal control circuit 13, the address input circuit 14, the column decoder 26, and the row decoder 27 are shown in FIG. 11. The selection terminal SEL is connected to the column decoder 26 and the row decoder 27. A selection signal provided from outside the RAM 10 is provided to the column decoder 26 and the row decoder 27 via the selection terminal SEL.

Figure 12:
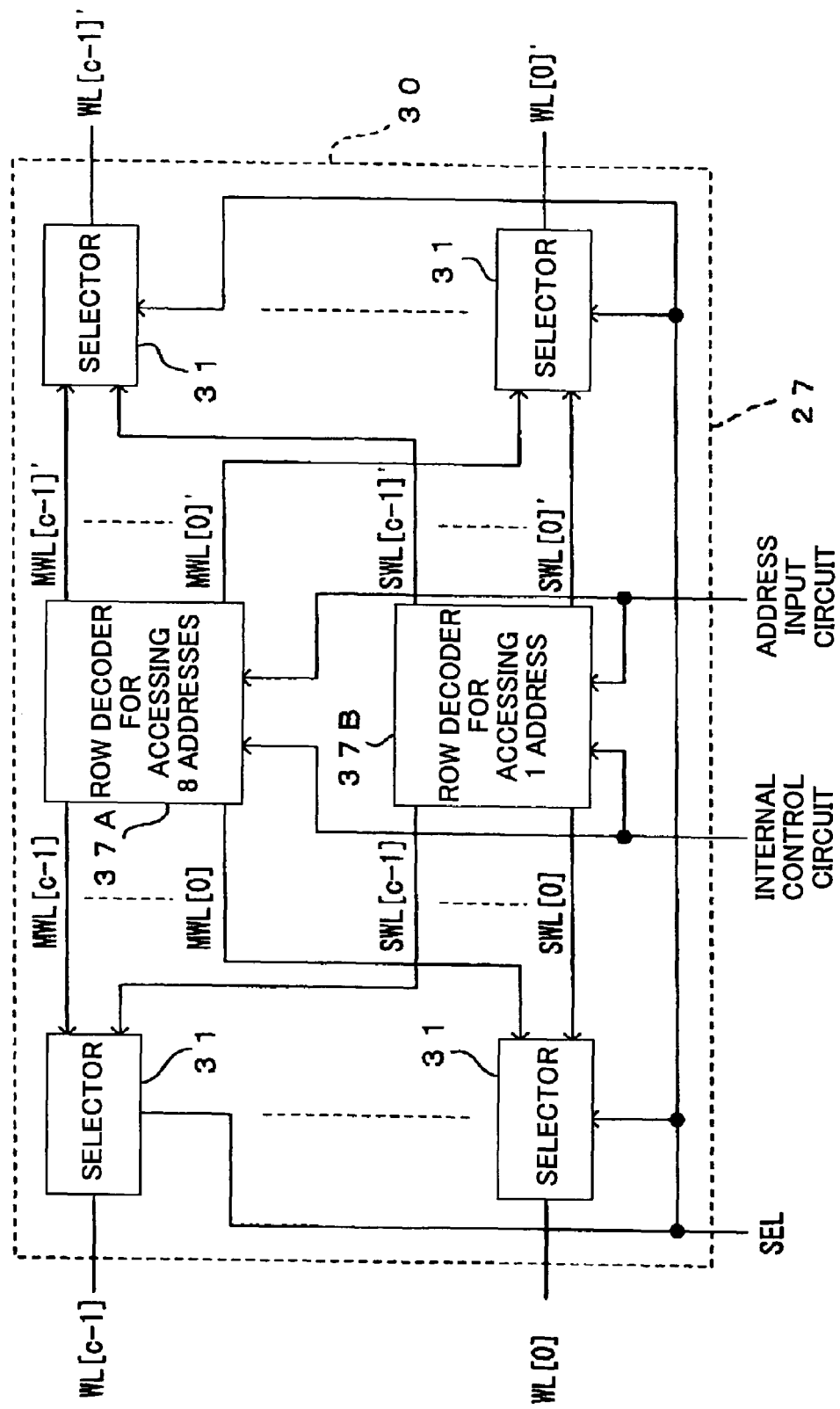
FIG. 12 shows an example of a configuration of a row decoder of the third embodiment.

FIG. 12 shows an internal configuration of the row decoder 27. In this row decoder 27, a first row decoder 37A for accessing eight addresses causes one or two signal lines out of signal lines MWL[c-1:0] to rise, and causes one or two signal lines out of signal lines MWL[c-1:0]' to rise. Meanwhile, a second row decoder 37B for accessing a single address causes a single signal line out of signal lines SWL[c-1:0] and SWL[c-1:0]' to rise. The signal lines MWL[c-1:0], the signal lines MWL[c-1:0]', the signal lines SWL[c-1:0], and the signal lines SWL[c-1:0]' are connected to selectors 31, respectively. In this example, when SEL=0, signals at the side of the signal lines MWL[c-1:0] and MWL[c-1:0]' are selected, and when SEL=1, a signal at the side of the signal lines SWL[c-1:0] and SWL[c-1:0]' is selected.

Figure 13:
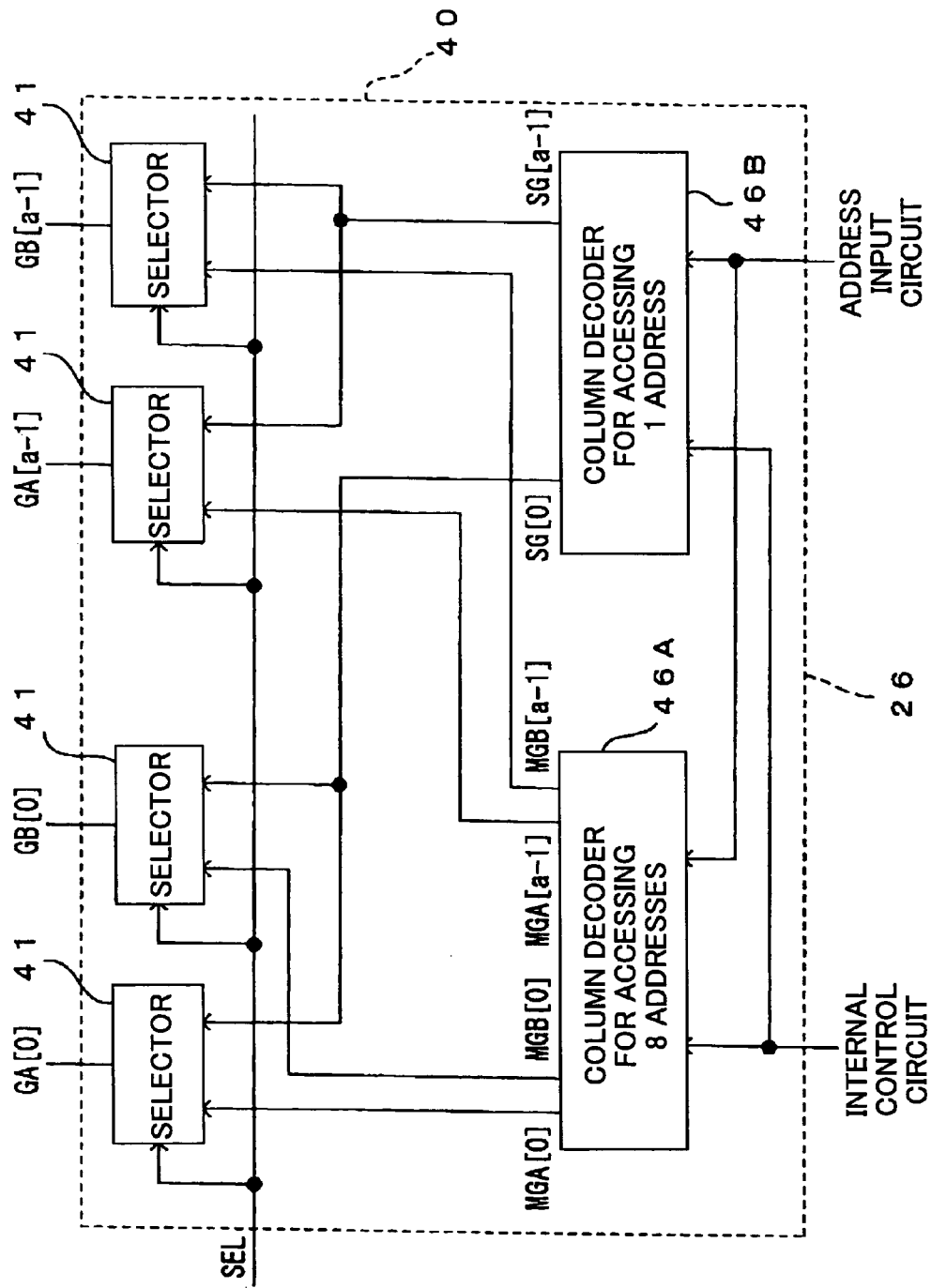
FIG. 13 shows an example of a configuration of a column decoder of the third embodiment.
Figure 15:
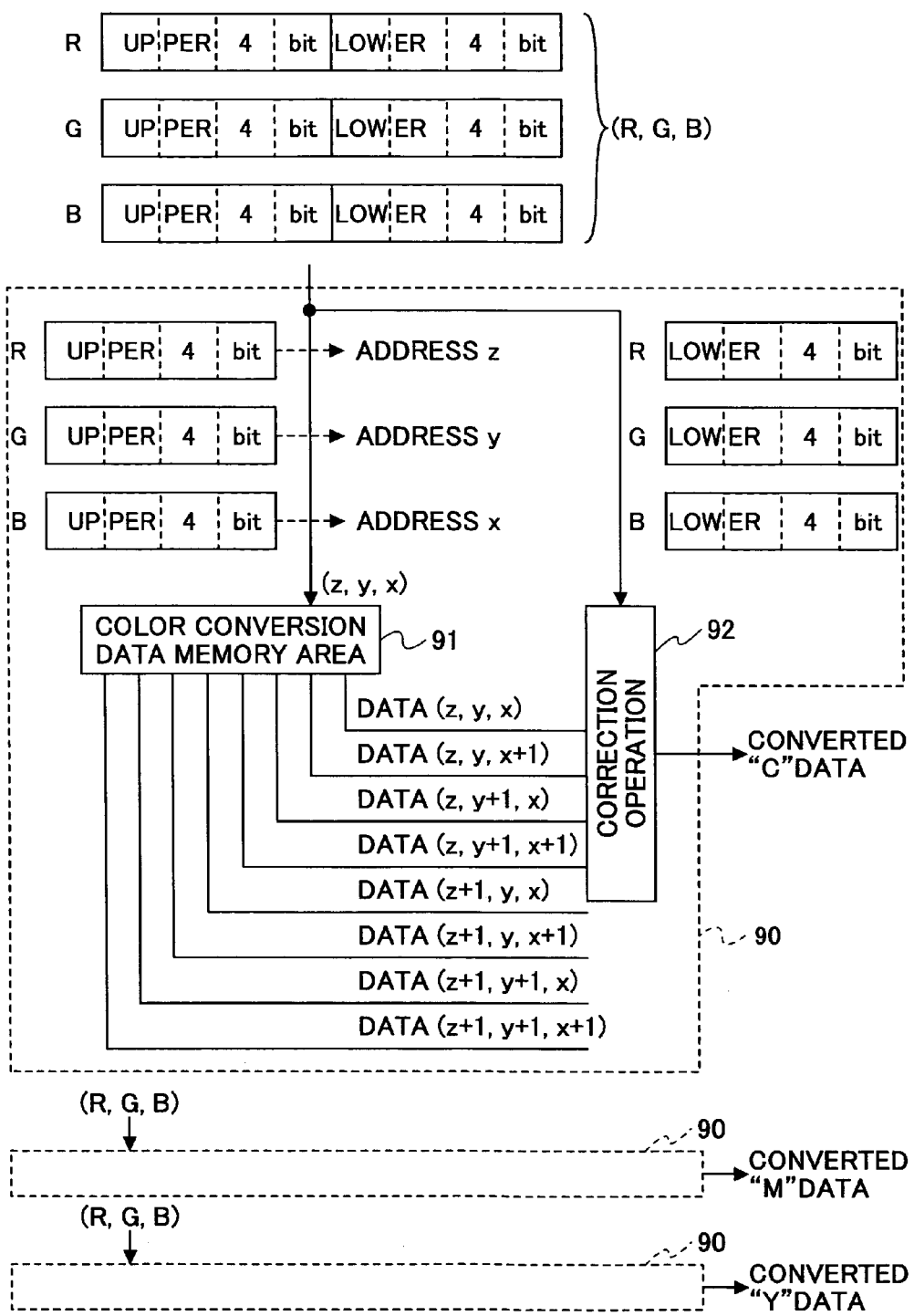
FIG. 15 shows a color conversion data memory area including a plurality of memory arrays in the related art.

FIG. 13 shows an internal configuration of the column decoder 26. In this column decoder 26, a third decoder 46A for accessing eight addresses causes eight signal lines out of signal lines MGA[a-1:0] to rise, and causes eight signal lines out of signal lines MGB[a-1:0] to rise so as to access the blocks corresponding to the eight addresses. Meanwhile, a fourth decoder 46B for accessing a single address causes a single signal line out of signal lines SG[a-1:0] to rise. The signal lines MGA[a-1:0] and MGB[a-1:0] are connected to selectors 41, respectively. The signal lines SG[a-1:0] are connected to the selectors 41 to which the signal lines GA[a-1:0] and GB[a-1:0] are connected such that the reference numbers inside the mark [ ] of SG[a-1:0] correspond to the same reference numbers of GA[a-1:0] and GB[a-1:0], as shown in FIG. 13. At the time of accessing a single address, a single word line is made to rise, so that even if signal lines GA and GB having the same reference number inside the mark [ ] are made to rise, there is no problem with this configuration. In this example, when SEL=0, signals at the side of MGA and MGB are selected, and when SEL=1, a signal at the side of SG is selected.

As described above, in the third embodiment, the selection terminal SEL, and the column decoder 26 and the row decoder 27 are arranged in the above-described manner, so that it is possible to select either the first mode where the eight addresses are accessed simultaneously or the second mode where a single address is accessed. Accordingly, depending on operational necessity, it is possible to access a single address without performing troublesome control.

In the third embodiment, at the time of accessing a single address in the address arrangement shown in FIGS. 3A and 3B, two input address data (or two address input terminals) X[1:0], two input address data Y[1:0], and two input address data Z[1:0] suffices. On the other hand, in the case of simultaneously accessing eight addresses in the address arrangement shown in FIG. 8, when the base address values (z, y, x) are the maximum values (3, 3, 3), it is possible to access up to the address values (4, 4, 4) that are generated by adding "1" to each of the base address values (3, 3, 3). However, in the address arrangement shown in FIG. 8, at the time of accessing a single address, it is necessary to use three input address data X[2:0], three input address data Y[2:0], and three input address data Z[2:0].

Next, a fourth embodiment of the present invention will be described. In the address arrangement shown in FIGS. 3A and 3B, there is no address having the address value "4". Accordingly, the base address having the address value "3" is not applied to the address arrangement shown in FIGS. 3A and 3B. In order to solve this problem, there is provided a method for accessing the address having the address value of "0" instead of accessing the address having the address value "4". This access method according to the fourth embodiment can be applied to the address arrangement shown in FIGS. 3A and 3B by configuring a column decoder shown in FIG. 5 and a row decoder shown in FIG. 6 so as to use the base address (z, y, x) having the address value "3".

Furthermore, in the fourth embodiment, as for the address arrangement shown in FIG. 8, when the maximum allowable base address value of (z, y, x) is "4", the address value "5" that is generated by adding "1" to the base address that includes the address value "4" is not used. In this case, instead of accessing the address having the address value "5", the address having the address value "0" is accessed. That is, in the case of the base address value "4" of z, y, x, "z+1" is converted to "0", "y+1" is converted to "0", and "z+1" is converted to "0". This access method according to the fourth embodiment can be applied to the address arrangement shown in FIG. 8 by configuring a column decoder shown in FIG. 5 and a row decoder shown in FIG. 6 so as to use the base address value "4" of z, y, x.

Next, a fifth embodiment of the present invention will be described. In order to realize a RAM that allows the data of eight addresses to be read and written simultaneously, the following another method can be used. In the case where four word lines WL at most are made to rise at one side of the row decoder 7 in the RAM 10 of the first embodiment, the data collides with each other on the bit line BL. In order to solve this problem, according to the fifth embodiment, four roots of selection signals for the division word line selectors that are output from the column decoder 6 are set for the division word line selectors arranged in one memory array 1 such that the four roots of selection signals are separately provided to four division word line selectors arranged in one memory array 1, respectively (this configuration is not shown in the drawings). Furthermore, in the fifth embodiment, the RAM 10 may be configured such that one, two, or four word lines WL are made to rise simultaneously at each side of the row decoder. This configuration may correspond to the address arrangement of FIGS. 4A through 4D with the row decoder being omitted.

Next, a sixth embodiment of the present invention will be described. When high operation speed is not much required, a RAM that allows four addresses to be accessed simultaneously may be used instead of using the RAM that allows eight addresses to be accessed simultaneously. In the case of the RAM that allows four addresses to be accessed simultaneously, wiring for transmitting data becomes half of wiring of the RAM that allows eight addresses to be accessed simultaneously, and therefore, a wiring area is decreased. As in FIG. 19A, one RAM of c×a=2×8 is configured so as to comprise the RAMs including the marks "0" and "4". In the same manner, another-RAM is configured so as to comprise the RAM including "①" and "⑤", another RAM is configured so as to comprise the RAM including "②" and "⑥", and another RAM is configured so as to comprise the RAM including "③" and "⑦". However, in this case where the four RAMs are used, control circuits inside the RAMs are overlapped, and a wiring area for connecting the four RAMs to an external address decoding circuit becomes necessary, resulting in an increased chip area.

On the other hand, according to the sixth embodiment of the present invention, there is provided a RAM that allows data of four addresses to be read and written simultaneously in the same manner of the RAM that allows data of eight addresses to be read and written simultaneously. A circuit configuration of the RAM in the sixth embodiment is basically the same as that of the RAM shown in FIG. 1. However, the RAM of the sixth embodiment is different from the RAM shown in FIG. 1 in that the number of the signal lines that are enabled simultaneously for selecting the division word lines is four instead of eight, and only four sets of data lines are provided in the sixth embodiment. For example, in the case of the address arrangement shown in FIGS. 3A and 3B, when the base address (z, y, x) is (1, 1, 1), the four word lines that include the addresses (1, 1, 1), (1, 1, 2), (1, 2, 1), and (1, 2, 2) are made to rise. In this case, a row decoder needs to be positioned at the center part of the RAM, or a row decoder needs to be provided to each of the memory arrays. Meanwhile, in the case of using the address arrangement shown in FIGS. 14A and 14B, two word lines WL at most need to rise simultaneously. Accordingly, in the case of using the address arrangement of FIGS. 14A and 14B, if all of the memory arrays are arranged at one side of the row decoder, there is no problem.

Furthermore, by applying the circuit configuration of the second embodiment to a circuit configuration of the sixth embodiment, the RAM that allows four addresses to be accessed simultaneously can be configured so that the data corresponding to the address (z, y, x) is always input to and output from a certain group of the "b" number of data input/output circuits, the data corresponding to the address (z, y, x+1) is always input to and output from another group of the "b" number of data input/output circuits, and other data corresponding to other addresses is always input to and output from other groups of the "b" number of data input/output circuits, respectively.

In addition, in the same manner of the first mode and the second mode described in the third embodiment, it is possible to select either a mode for accessing four addresses simultaneously or a mode for accessing a single address.

This patent application is based on Japanese priority patent application No. 2002-060640 filed on Mar. 6, 2002, the entire contents of which are hereby incorporated by reference.

What is claimed is:

1. A semiconductor storing device in which a row of memory cells is selected by a word line stage and a division word line stage, comprising:

memory arrays that each include a plurality of memory cells arranged in a matrix;

word lines for respective rows of the memory cells;

division word lines each of which is connected to the memory cells arranged in one row corresponding to one word;

division word line selectors that select the division word lines, respectively, the division word lines being connected to the respective word lines via the division word line selectors, respectively;

pairs of bit lines for reading data from the memory cells and writing data to the memory cells that are connected to the pairs of the bit lines, respectively;

column gates connected to the pairs of bit lines, respectively;

pairs of data lines that are connected to the pairs of bit lines via the column gates, respectively, to communicate data;

write buffers for data writing that are connected to the pairs of data lines, respectively;

sense operational amplifiers for data reading that are connected to the pairs of data lines, respectively; and data input/output circuits that are connected to the pairs of data lines via the write buffers and the sense operational amplifiers, respectively, wherein input address data is specified by address data X[i:0], Y[j:0], and Z[k:0], two roots of selection signals for selecting the division word line selectors are provided alternately to the division word lines arranged in one of the memory arrays, and one of the two roots of the selection signals is enabled to select one of the division word line selectors in the one of the memory arrays, and eight roots of the selection signals in the entire semiconductor storing device are enabled so that when an address (z, y, x) is specified by the input address data X[i:0], Y[j:0], and Z[k:0], eight addresses of (z, y, x), (z, y, x+1), (z, y+1, x), (z, y+1, x+1), (z+1, y, x), (z+1, y, x+1), (z+1, y+1, x), and (z+1, y+1, x+1) are accessed simultaneously.

2. The semiconductor storing device according to claim 1, further comprising selectors that are provided between the write buffers and the data input/output circuits, and between the sense operational amplifiers and the data input/output circuits, respectively such that the data input/output circuits always correspond one-to-one to the eight addresses of (z, y, x), (z, y, x+1), (z, y+1, x), (z, y+1, x+1), (z+1, y, x), (z+1, y, x+1), (z+1, y+1, x), and (z+1, y+1, x+1), respectively, and always transmit and receive, via the selectors, respective input data and output data corresponding one-to-one to the eight addresses, respectively.

3. The semiconductor storing device according to claim 1, wherein when at least one of z, y, and x of the address (z, y, x) is an allowable maximum value, at least one of z+1, y+1, and x+1 that corresponds to the at least one of x, y, and z having the allowable maximum value is converted to "0" to access the eight addresses simultaneously.

4. The semiconductor storing device according to claim 1, further comprising selection means for selecting either a first mode in which the eight addresses are accessed simultaneously, or a second mode in which a single address is accessed.

5. A semiconductor storing device in which a row of memory cells is selected by a word line stage and a division word line stage, comprising:
   memory arrays that each include a plurality of memory cells arranged in a matrix;
   word lines for respective rows of the memory cells;
   division word lines each of which is connected to the memory cells arranged in one row corresponding to one word;
   division word line selectors that select the division word lines, respectively, the division word lines being connected to the respective word lines via the division word line selectors, respectively;
   pairs of bit lines for reading data from the memory cells and writing data to the memory cells that are connected to the pairs of the bit lines, respectively;
   column gates connected to the pairs of bit lines, respectively;
   pairs of data lines that are connected to the pairs of bit lines via the column gates, respectively, to communicate data;
   write buffers for data writing that are connected to the pairs of data lines, respectively;
   sense operational amplifiers for data reading that are connected to the pairs of data lines, respectively; and
   data input/output circuits that are connected to the pairs of data lines via the write buffers and the sense operational amplifiers, respectively,
   wherein input address data is specified by address data X[i:0], Y[j:0], and Z[k:0], four roots of selection signals for selecting the division word line selectors are provided to the division word lines arranged in one of the memory arrays, and one of the four roots of the selection signals is enabled to select one of the division word line selectors in the one of the memory arrays, and
   eight roots of the selection signals in the entire semiconductor storing device are enabled so that when an address (z, y, x) is specified by the input address data X[i:0], Y[j:0], and Z[k:0], eight addresses of (z, y, x), (z, y, x+1), (z, y+1, x), (z, y+1, x+1), (z+1, y, x), (z+1, y, x+1), (z+1, y+1, x), and (z+1, y+1, x+1) are accessed simultaneously.

6. The semiconductor storing device according to claim 5, further comprising
   selectors that are provided between the write buffers and the data input/output circuits, and between the sense operational amplifiers and the data input/output circuits, respectively such that the data input/output circuits always correspond one-to-one to the eight addresses of (z, y, x), (z, y, x+1), (z, y+1, x), (z, y+1, x+1), (z+1, y, x), (z+1, y, x+1), (z+1, y+1, x), and (z+1, y+1, x+1), respectively, and always transmit and receive, via the selectors, respective input data and output data corresponding one-to-one to the eight addresses, respectively.

7. The semiconductor storing device according to claim 5, wherein in a case where when the address (z, y, x) is specified, an address determined by at least one of z+1, y+1, and x+1 does not exist in the semiconductor storing device, the at least one of z+1, y+1, and x+1 is converted to "0" to access the eight addresses simultaneously.

8. The semiconductor storing device according to claim 5, further comprising selection means for selecting either a first mode in which the eight addresses are accessed simultaneously, or a second mode in which a single address is accessed.

9. A semiconductor storing device in which a row of memory cells is selected by a word line stage and a division word line stage, comprising:
   memory arrays that each include a plurality of memory cells arranged in a matrix;
   word lines for respective rows of the memory cells;
   division word lines each of which is connected to the memory cells arranged in one row corresponding to one word;
   division word line selectors that select the division word lines, respectively, the division word lines being connected to the respective word lines via the division word line selectors, respectively;
   pairs of bit lines for reading data from the memory cells and writing data to the memory cells that are connected to the pairs of the bit lines, respectively;
   column gates connected to the pairs of bit lines, respectively;
   pairs of data lines that are connected to the pairs of bit lines via the column gates, respectively, to communicate data;
   write buffers for data writing that are connected to the pairs of data lines, respectively;
   sense operational amplifiers for data reading that are connected to the pairs of data lines, respectively; and
   data input/output circuits that are connected to the pairs of data lines via the write buffers and the sense operational amplifiers, respectively,
   wherein input address data is specified by address data X[i:0], Y[j:0], and Z[k:0], two roots of selection signals for selecting the division word line selectors are provided alternately to the division word lines arranged in one of the memory arrays, and one of the two roots of the selection signals is enabled to select one of the division word line selectors in the one of the memory arrays, and
   four roots of the selection signals in the entire semiconductor storing device are enabled so that when an address (z, y, x) is specified by the input address data X[i:0], Y[j:0], and Z[k:0], four addresses of (z, y, x), (z, y, x+1), (z, y+1, x), and (z, y+1, x+1) are accessed simultaneously.

10. The semiconductor storing device according to claim 9, further comprising
    selectors that are provided between the write buffers and the data input/output circuits, and between the sense operational amplifiers and the data input/output circuits, respectively such that the data input/output circuits always correspond one-to-one to the four addresses of (z, y, x), (z, y, x+1), (z, y+1, x), and (z, y+1, x+1), respectively, and always transmit and receive, via the selectors, respective input data and output data corresponding one-to-one to the four addresses, respectively.

11. The semiconductor storing device according to claim 9, wherein in a case where when the address (z, y, x) is specified, an address determined by at least one of z+1, y+1, and x+1 does not exist in the semiconductor storing device, the at least one of z+1, y+1, and x+1 is converted to "0" to access the four addresses simultaneously.

12. The semiconductor storing device according to claim 9, further comprising selection means for selecting either a first mode in which the four addresses are accessed simultaneously, or a second mode in which a single address is accessed.

* * * * *